(12) United States Patent
Petrarca et al.

(10) Patent No.: US 8,439,728 B2
(45) Date of Patent: May 14, 2013

(54) RETICLE CARRIER

(75) Inventors: Kevin S. Petrarca, Newburgh, NY (US); Donald F. Canaperi, Averill Park, NY (US); Mahadevaiyer Krishnan, Hopewell Junction, NY (US); Rebecca D. Mih, Los Gatos, CA (US); Steven Steen, Peekskill, NY (US); Henry Grabarz, Shelton, CT (US); Michael S. Hibbs, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 21 days.

(21) Appl. No.: 13/278,571

(22) Filed: Oct. 21, 2011

(65) Prior Publication Data

US 2012/0040277 A1 Feb. 16, 2012

Related U.S. Application Data

(62) Division of application No. 11/749,384, filed on May 16, 2007, now Pat. No. 8,110,321.

(51) Int. Cl.
*B24B 41/06* (2012.01)

(52) U.S. Cl.
USPC .......................................... 451/388; 451/365

(58) Field of Classification Search .................. 451/388, 451/365
See application file for complete search history.

(56) References Cited

U.S. PATENT DOCUMENTS

| 5,565,286 | A | 10/1996 | Lin |
| 5,932,377 | A | 8/1999 | Ferguson et al. |
| 6,051,344 | A | 4/2000 | Langston et al. |
| 6,660,653 | B1 | 12/2003 | Tzu et al. |
| 6,821,162 | B2 | 11/2004 | Donohue |
| 2003/0036340 | A1 | 2/2003 | Moriya et al. |

*Primary Examiner* — Daborah Chacko Davis
(74) *Attorney, Agent, or Firm* — Louis J. Percello; Ryan, Mason & Lewis, LLP

(57) ABSTRACT

A reticle carrier for a polishing tool capable of accommodating a reticle includes a base plate with an obverse and reverse surfaces, a retaining ring secured to the obverse surface of the base plate forming a recess defined by the obverse surface of the rigid base plate and internal edges of the retaining ring. A reticle pad supports a reticle in the recess. The base plate and the reticle pad having an array of matching, aligned passageway holes therethrough for exhaustion of air from space between the base plate and a the reticle and for supply of air to that space so a vacuum can retain a the reticle in place on the reticle carrier under vacuum conditions and application of air under pressure can eject a reticle from the reticle carrier.

13 Claims, 18 Drawing Sheets

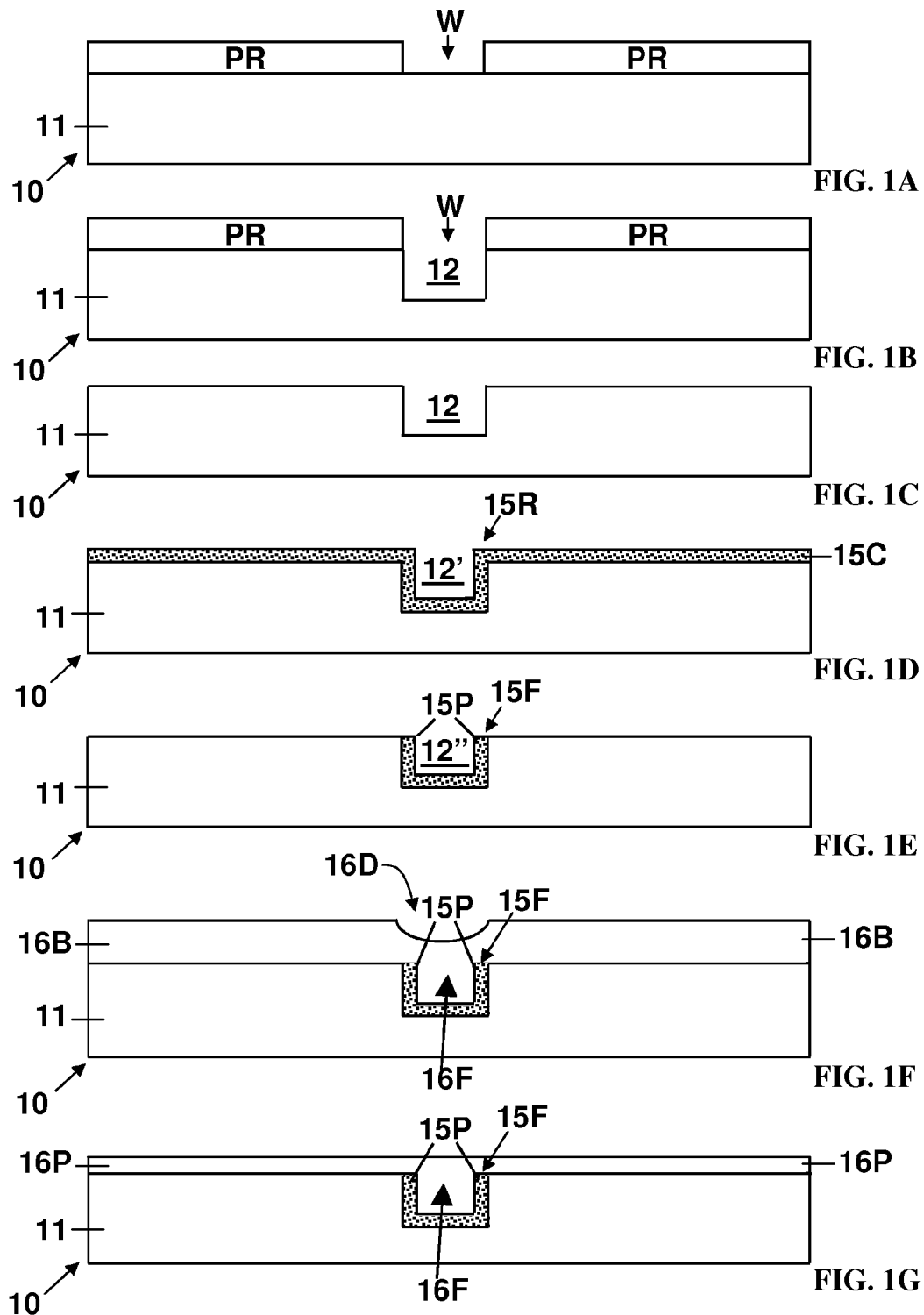

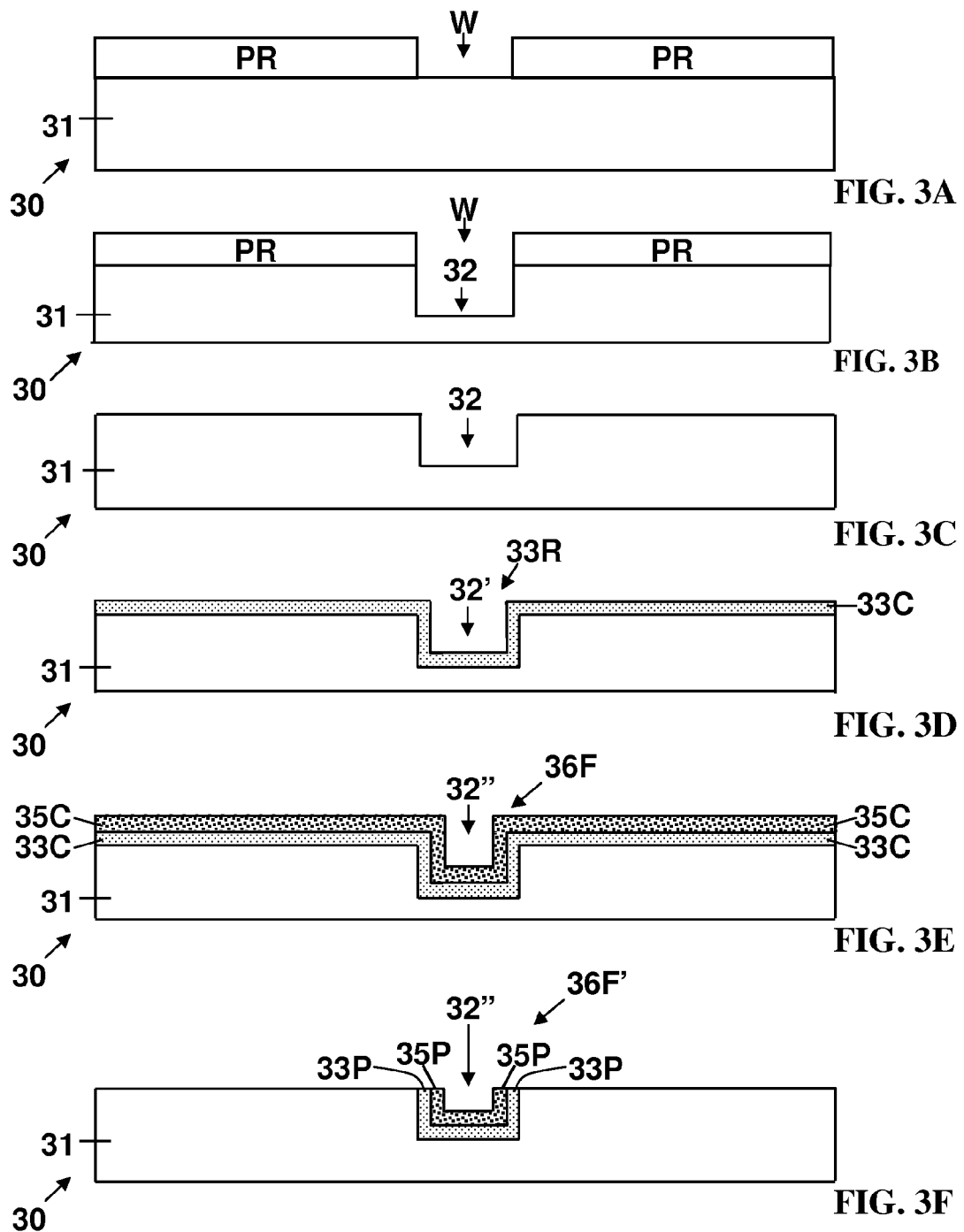

| TRANSPARENT MATERIAL | REFRACTIVE INDEX |
|---|---|
| $CaF_2$ | 1.434 |
| $BaF_2$ | 1.474 |
| glass | 1.5-1.9 |
| synthetic quartz (fused silica) | 1.458 |
| crystalline quartz | 1.544 ($n_o$), 1.553 ($n_e$) |
| calcite | 1.658 ($n_o$), 1.486 ($n_e$) |
| sapphire | 1.769 |
| diamond | 2.417 |
| silicon | 3.478 (1.55µm) |
| ZnSe | 2.624<br>2.403 (10.6 µm) |

| COLLOIDALLY GROWN SILICA | ACID STABILIZED, PARTICLE SIZE 20-200nm, SOLID LOADING 2-20% |
|---|---|
| HYDROGEN PEROXIDE | 30% SOLUTION, ADDED AT A CONCENTRATION OF 2-50 ml/L |
| CORROSION INHIBITOR | 0.1-10 g/L |
| POLYACRYLIC ACID | MW 2000, 0.1-10 g/L |
| OXIDE POLISH RATE INHIBITOR | 0.1-10 ml/L |
| WATER | ADD ENOUGH WATER TO BRING TO VOLUME |

FIG.15

| SLURRY | COMMERCIALLY AVAILABLE FUMED SILICA STABILIZED AT ALKALINE pH (pH RANGE 9-12) |
|---|---|
| pH | ADJUSTED TO 2.4 (RANGE 2.2-2.6) |
| SOLUTION FOR pH ADJUSTMENT | 10X DILUTION IN WATER OF 86 PERCENT PHOSPHORIC ACID (1 PART ACID TO 9 PARTS PHOSPHORIC ACID) |

FIG.16

| POLISHING TOOL | WESTECH |
|---|---|
| PAD | CONVENTIONAL URETHANE TOP PAD (IC1000), NON-WOVEN SUBPAD (SUBA IV) |
| SLURRY FLOW | 150 ml/min (RANGE 75- 250 ml/min) |
| DOWNFORCE | 3 psi, (RANGE 1-8 psi) |
| SPEED | 25 rpm PLATEN, 50 rpm CARRIER (SPEED RATIO SHOULD BE ADJUSTED FOR BEST UNIFORMITY) |
| WAFER BACKSIDE PRESSURE | 2 PSI; ADJUSTED FOR OPTIMUM UNIFORMITY |
| PAD CONDITIONING | DIAMOND GRIT, 70 MICRON, 0.5 psi, for 45 SECONDS AFTER EACH POLISH |

FIG.17

RETICLE CARRIER

BACKGROUND OF THE INVENTION

The present invention relates to methods of manufacture of photolithographic reticles, i.e. masks, and reticles produced thereby. More particularly this invention relates to methods for fabrication of reticles for exposure of microelectronic integrated circuits and other micro-scale devices and to the reticles produced thereby.

During the process of manufacturing of microelectronic integrated circuits on a substrate comprising a workpiece such as a semiconductor wafer or the like, layers of material on the workpiece are patterned photolithographically. A layer of a radiation sensitive resist (hereinafter resist) is deposited on the workpiece. The resist (e.g. photoresist) comprises a radiation sensitive material which can be exposed to a master image projected as patterns of radiation, e.g. light, ultraviolet light, x-ray, electron beam, or other forms of radiation. The resist is later exposed using an exposure tool and a reticle. The reticle comprises a photomask or the like which is patterned with opaque regions, transparent regions and possibly partially transparent regions. During the exposure process, radiation is directed onto the reticle to expose the resist selectively with patterns of radiation projected through the reticle.

The resist is developed, and then the remaining resist forms a mask on the workpiece which protects areas of the workpiece during subsequent fabrication processes, such as deposition, etching, or ion implantation. A mask or photomask is generally used for photoimaging with a positive or negative image when exposing a photosensitive material known as photoresist or analogous materials sensitive to electromagnetic or other forms of radiation.

Binary Reticle

A binary reticle includes a pattern corresponding to features to be formed on work pieces such as FET devices or other Integrated Circuit (IC) features. A binary reticle may be formed on a reticle mask plate comprising a transparent glass plate coated with a patterned, opaque (light blocking) material. This type of reticle is typically referred to as a binary mask since some of the light is completely blocked by the opaque material and the remainder of the light is fully transmitted through the transparent, glass portions.

Chrome On Glass (COG) Binary Reticle

A Chrome-On-Glass (COG) reticle (i.e. a mask, photomask, or photoreticle) typically comprises a quartz-chrome patterned mask. In more detail, a COG reticle comprises a single crystal quartz reticle mask plate that is substantially planar, which carries a mask pattern defined using a patterned chrome ($Cr/CrO_2$) layer, formed by sputtering. The chrome layer is laminated to the top surface of the reticle mask plate. A virgin or blank COG reticle mask plate or mask blank comprises a virgin reticle which has not been patterned. In other words, a virgin COG reticle comprises an unpatterned or blank planar layer of chrome deposited on a quartz reticle mask plate.

In the production of a COG patterned reticle, e.g. an Integrated Circuit Device (ICD), an image of one or more microelectronic devices is printed onto a virgin COG reticle via a lithographic process by exposure to radiation. A layer of resist is applied to the blank COG reticle mask plate covering the top surface of the chrome layer. After patterning by exposure of the resist to a master image, the resist is developed to reproduce the exposed pattern thereby producing openings down to the surface of the chrome of the COG mask. Exposed surfaces of the COG mask are removed by etching leaving the remaining portions of the chrome layer intact. Then the resist is removed with appropriate chemicals and washed away.

In the context of photolithography, the term reticle refers to a semiconductor photomask, which contains an image which is adapted to expose only a small part of a semiconductor wafer which is to be employed in a step-and-repeat exposure system, i.e. a wafer stepper or scanner. A semiconductor reticle typically contains the pattern of a several semiconductor devices. The reticle is employed in the wafer stepper to project an image to be exposed over and over onto a workpiece comprising a semiconductor wafer covered with unexposed photoresist by moving the workpiece relative to the reticle with the wafer stepper or scanner, which is employed to expose several areas of the unexposed photoresist repeatedly and sequentially.

In addition to visible light, the absorber may be capable of absorbing radiation such as infra-red, x-ray, E-beam, or light in ranges such as the UltraViolet (UV) range, Deep UltraViolet (DUV) range, Vacuum UltraViolet (VUV) range, and Extreme UltraViolet range (EUV).

The present invention relates to processing of integrated circuit devices and particularly to the manufacturing of optical projection masks for deep submicron (<0.25 µm) integrated circuit processes.

A common method of manufacturing of projection reticles for exposure of integrated circuit devices has relied on etching a pattern into an actinic radiation absorber comprising a layer of absorbent material which is deposited on a reticle mask plate (i.e. a transparent substrate or mask blank.) Currently in semiconductor fabrication the patterning of structures on a substrate is often performed with reticles defined by lithography performed on a blank COG reticle.

There is a serious problem with the process of etching through the chrome of a COG reticle mask plate down to the quartz therebelow which is that the etching process for the chrome also consumes the photoresist mask very quickly which forces certain restrictions in the mask making process (e.g. resist thickness.)

There are other serious problems with etched COG reticles. One such problem with etched COG reticles is that Electro-Static Discharge (ESD) can cause damage to the metal (chrome) pattern on a substrate composed of quartz as the insulating material. The problem is that unwanted Electro-Static Discharge (ESD), involving rapid dissipation of electric charge in a short amount of time, often causes delamination of the chrome pattern from the quartz substrate. In other words, at least a portion of the chrome pattern on the quartz substrate is lifted away from the top surface thereof, as the ESD energy is being dissipated in the laminated material. That renders the mask defective so that it is not useful for the fabrication of devices on semiconductor substrates.

Another serious problem with COG reticles is that they grow defects over the lifetime of the mask which limits the useful lifetime of such reticles and forces regular cleaning.

Phase Shift Mask (PSM)

Another type of reticle is the Phase Shift Mask (PSM), which can be produced by allowing some light to pass through a partially-transmissive chrome feature thereby changing the phase of the light that passes therethrough, i.e. creating phase shifted light. The phase shifted light from the partially-transmissive feature affects the interference pattern of the light transmitted from neighboring fully transparent areas, resulting in a higher contrast at the imaging plane. This allows imaging features with significantly smaller feature sizes than would be possible using the same mask pattern implemented as a standard COG reticle. These reticles are referred to as attenuated PSM (AttPSM) reticles.

Alternating PSM (AltPSM) Mask

A third type of reticle is known as an Alternating PSM (AltPSM) reticle (mask) wherein feature recesses are etched into the virgin reticle mask plate. The feature recesses result in a path length difference for the light passing therethrough, and the depth of the feature recess is tuned to result in a 180° phase shift of the incident electromagnetic radiation to be used in exposure of the image on the reticle. The AltPSM mask has limitations in that the termination of features can be difficult and a second mask called a block out has to be used in conjunction therewith to terminate the features that are desired on the substrate. The higher cost of these AltPSM reticle processes is negligible in view of expenses saved as compared to more advanced lithography tooling that would be required when only COG reticles would be used. However the cost of fabrication of a mask set has increased dramatically by introducing those extra processing steps required for AltPSM reticle processing.

Commonly assigned U.S. Pat. No. 5,932,377 of Ferguson et al. entitled "Exact Transmission Balanced Alternating Phase-Shifting Mask for Photolithography" describes forming an AltPSM mask with etched-quartz trenches. It states that a phase difference between two clear shapes for an AltPSM is achieved in standard industry practice by selectively etching into a quartz reticle mask plate so an optical path difference equivalent to the desired phase offset is obtained between two adjacent openings. After standard mask patterning, a second write step is used to selectively open a protective resist coating for a phase-shifted opening leaving a non-phase shifted opening covered. Typically, the quartz is then etched with an anisotropic Reactive-Ion Etching (RIE) process.

Commonly assigned U.S. Pat. No. 5,565,286 of Lin entitled "Combined Attenuated-Alternating Phase Shifting Mask Structure and Fabrication Methods Therefor" describes a structure and fabrication method for a phase-shifting lithographic mask. AttPSM and AltPSM are combined to provide a mask combination consisting of phase-shifted and unshifted attenuated backgrounds in which the phase-shifted attenuated background surrounds the unshifted components and the unshifted attenuated background surrounds the phase-shifted components.

U.S. Pat. No. 6,660,653 of Tzu et al. entitled "Dual Trench Alternating Phase Shift Mask Fabrication" describes fabricating a dual-trench AltPSM mask. A chromium layer formed over a quartz layer of the PSM is patterned with deep trenches by dry etching through a photoresist layer. The quartz layer is dry etched through another photoresist layer applied over the chromium layer and patterned according to the deep trenches and the shallow trenches of the AltPSM design using backside exposure to ultraviolet light.

Damascene Patterning

Traditionally, the term damask refers to rich tapestry patterns of damask silk, such as a figured fabric of silk, wool, linen, cotton, or synthetic fibers, with a pattern formed by weaving. An artistic damascene process of metal work involves inlaying metal into trenches in another metal is a process of inlaying different metals into one another, e.g. gold or silver into a darkly oxidized steel background, to produce intricate patterns.

In semiconductor technology, damascene or dual-damascene metal patterning processes have been employed in forming copper interconnects in a dielectric layer, e.g. silicon oxide, for external electrical connections and interconnections of semiconductor devices. The semiconductor damascene process starts by a subtractive process of etching open trenches reaching down into a dielectric layer wherein copper conductor patterns are to be formed. An additive patterning process is employed involving deposition of a conformal barrier layer followed by deposition of a blanket (thick) coating of copper that significantly overfills the trenches. Then, the excess copper is removed by planarization to the level of the top of the insulating layer by Chemical-Mechanical Polishing (CMP). The copper, which remains within the trenches of the insulating layer, comprises a patterned interconnect conductor.

U.S. Pat. No. 6,821,192 of Donohue entitled "Retaining Ring for Use in Chemical Mechanical Polishing" describes a retaining ring for use on a carrier head in a Semiconductor Wafer CMP (SWCMP) apparatus with a bottom surface, an inner surface and an outer surface, and a plurality of recesses on the bottom surface. Each recess includes an inner trailing surface and a slurry capture area. A channel connects the slurry capture area to the inner surface. The inner trailing surface can be configured for fastening thereon an insert tool having a contact edge for abrasively contacting a polishing pad. The Donohue patent states "Integrated circuits are typically formed on substrates, particularly silicon wafers, by the sequential deposition of conductive, semiconductive or insulative layers. After each layer is deposited, the layer is etched to create circuitry features. As a series of layers are sequentially deposited and etched, the outer or uppermost surface of the substrate, i.e., the exposed surface of the substrate, becomes successively less planar. This non-planar outer surface presents a problem for the integrated circuit manufacturer as a non-planar surface can prevent proper focusing of the photolithography apparatus. Therefore, there is a need to periodically planarize the substrate surface to provide a planar surface. Planarization, in effect, polishes away a non-planar, outer surface, whether a conductive, semiconductive, or insulative layer, to form a relatively flat, smooth surface."

Transmissivity, τ and Opacity

Transmissivity in the context of this invention is defined as the fraction of incident radiation (at actinic wavelength) that passes through a mask, more specifically, a mask plate or combination of materials in or on the mask plate. In the context of this invention a material is considered to be transparent if it has a maximum value of transmissivity equal to that of the mask plate or substrate without any other materials than quartz. Opacity is defined as the fraction of incident radiation (at actinic wavelength) that is absorbed while passing through a mask, more specifically, a mask plate or combination of materials in or on the mask plate. In the context of this invention a material is considered to be opaque (having a value of opacity nearing a value of 1) if practically all the light is absorbed in the material, e.g. darkly pigmented glass.

An object of this invention is to avoid the difficult absorber etch employed in the subtractive process employed in patterning COG masks.

Another object of this invention is to provide a method for fabricating an optical projection mask using DUV resists.

Still other objects of this invention are maximizing the choices of absorbing materials for the optical projection mask manufacturer; to increase throughput on pattern generating tools in the mask making environment (higher sensitivity of DUV resists); minimizing scattering from the projected pattern by adding a liner to function as a lens; focusing the exposure rays at the edge of the pattern to increase signal to noise levels; and using of different absorbing materials, therefore allowing to tune linewidth per exposure.

A further object of this invention is to provide a reticle carrier to hold the reticle during polishing with the carrier consisting of a metal base plate that has a number of passages through it; and to provide a reticle holding ring that is made of a low friction material that attaches to the base plate.

SUMMARY OF THE INVENTION

The present invention utilizes techniques that will allow the formation of a reticle by creating structures in a virgin reticle mask plate, the formation of which structures presents an opportunity to create multiple features that are not presently available in mask processing today.

This invention leaves the top surface of a reticle which is completely planar, improving the imaging performance by reducing the scattering of light between features. Such a fully planar surface also allows the sealing of the top surface of the reticle without adverse effects, eliminating growth of defects on the features of the reticle.

One aspect of this invention allows the difficult process of absorber etching to be replaced by a silicon dioxide etch into the quartz of a COG plate to form an etched pattern, followed by the process of filling the etched pattern with an actinic absorber.

As employed herein the term reticle is intended to be interpreted to be synonym of the terms mask, photomask, and photoreticle.

In accordance with this invention, a damascene method for manufacturing optical projection masks comprises patterning a substrate for an optical projection mask having a first level of transmissivity with a feature recess; and filling the recess with a material having a different level of transmissivity.

Preferably, the method involves forming a projection reticle in a transparent substrate having a top surface with a feature recess in the top surface of the transparent substrate; and forming a radiation transmissivity modifying material in the feature recess. The radiation transmissivity modifying material comprises a material selected from the group consisting of an opaque material and a partially transmissive material.

Preferably, the method involves forming a projection reticle in a transparent substrate having a top surface with a feature recess in the top surface of the transparent substrate, and forming a radiation transmissivity modifying material in the feature recess. The radiation transmissivity modifying material comprises a material selected from the group consisting of an opaque material and a partially transmissive material. A plurality of films may be included in the feature recess with the deposited films having different degrees of transmissivity. Preferably, the radiation transmissivity modifying material is selected from the group comprising at least two deposited films including an opaque film and a transmissive film and an opaque film deposited with a partially transmissive material.

Preferably a liner is formed juxtaposed with the radiation transmissivity modifying material as a lens for focusing the exposure rays at the edge of the pattern to increase signal to noise levels so that scattering from the projected pattern is minimized. Preferably a sacrificial material is present in the recess. Next, a material for modifying radiation transmissivity is formed juxtaposed with the sacrificial material. Then the sacrificial material is removed from the recess.

Preferably, the radiation transmissivity modifying material is deposited as a film upon the transparent substrate; and the radiation transmissivity modifying material is planarized with a polishing slurry consisting of fumed silica, a pH of from about 2.2 to about 2.6, and a 1:10 dilution in water on the order of one part of about 84% to about 88% parts phosphoric acid to 9 parts water, preferably deionized water.

Preferably a reticle carrier is provided for a polishing tool capable of accommodating a reticle comprising a rigid base plate; a retaining ring; a reticle pad adapted for supporting a reticle inserted onto the reticle carrier; and the base plate with the reticle pad having a plurality of aligned passageways therethrough for exhaustion of air from the space between the base plate and a reticle; whereby a vacuum is generated to retain a reticle in place under vacuum conditions and application of air under pressure can eject a reticle from the reticle carrier.

It is preferred that a metal base plate is provided having a plurality of passageways therethrough, preferably including a reticle pad installed on the metal base plate with matching aligned plurality of passageways therethrough. It is also preferred that a reticle holding ring is provided made of a low friction material that is attachable to the base plate.

In accordance with another aspect of this invention, a projection reticle is formed in a transparent substrate having a top surface comprising a feature recess in the top surface of the transparent substrate; and a radiation transmissivity modifying material is formed in the feature recess.

Preferably, the radiation transmissivity modifying material comprises a material selected from the group consisting of an opaque material, and a partially transmissive material. A plurality of deposited films may be included in the feature recess with the deposited films having different degrees of transmissivity.

Preferably, the radiation transmissivity modifying material is selected from the group comprising at least two deposited films including an opaque film and a transmissive film, and an opaque film deposited with a partially transmissive material.

Preferably, the radiation transmissivity modifying material comprises an opaque film juxtaposed with a phase error correction material selected from the group consisting of a solid or a gas. Preferably the recess has sidewalls and the radiation transmissivity modifying material is spaced away from the sidewalls by the phase error correction material.

Preferably, a liner is juxtaposed with the radiation transmissivity modifying material as a lens for focusing the exposure rays at the edge of the pattern to increase signal to noise levels, whereby scattering from the projected pattern is minimized.

In accordance with another aspect of this invention, a slurry for reticle polishing comprises fumed silica with a pH of from about 2.2 to about 2.6; and with on the order of a dilution of one part of 84-88% phosphoric acid in about 9 parts of water, preferably deionized water.

The invention and objects and features thereof will be more readily apparent from the following detailed description and appended claims when taken with the drawings.

BRIEF DESCRIPTION OF THE DRAWINGS

FIGS. 1A-1G are schematic, elevational sections of a reticle mask plate during the process of manufacture of a damascene reticle in accordance with this invention.

FIGS. 3A-3F are schematic, elevational sections of a reticle mask plate during the process of manufacture of another form of damascene reticle in accordance with the method of this invention in accordance with the method of this invention.

In combination.

FIG. 15 is a table showing representative slurry formulation.

FIG. 16 is a table showing the processing parameters and equipment employed for performing an exemplary Damascene Reticle CMP (DRCMP) process in accordance with this invention.

FIG. 17 is a table showing an implementation of the DRCMP process of this invention.

DETAILED DESCRIPTION OF PREFERRED EMBODIMENTS OF THE INVENTION

Figure 2A:
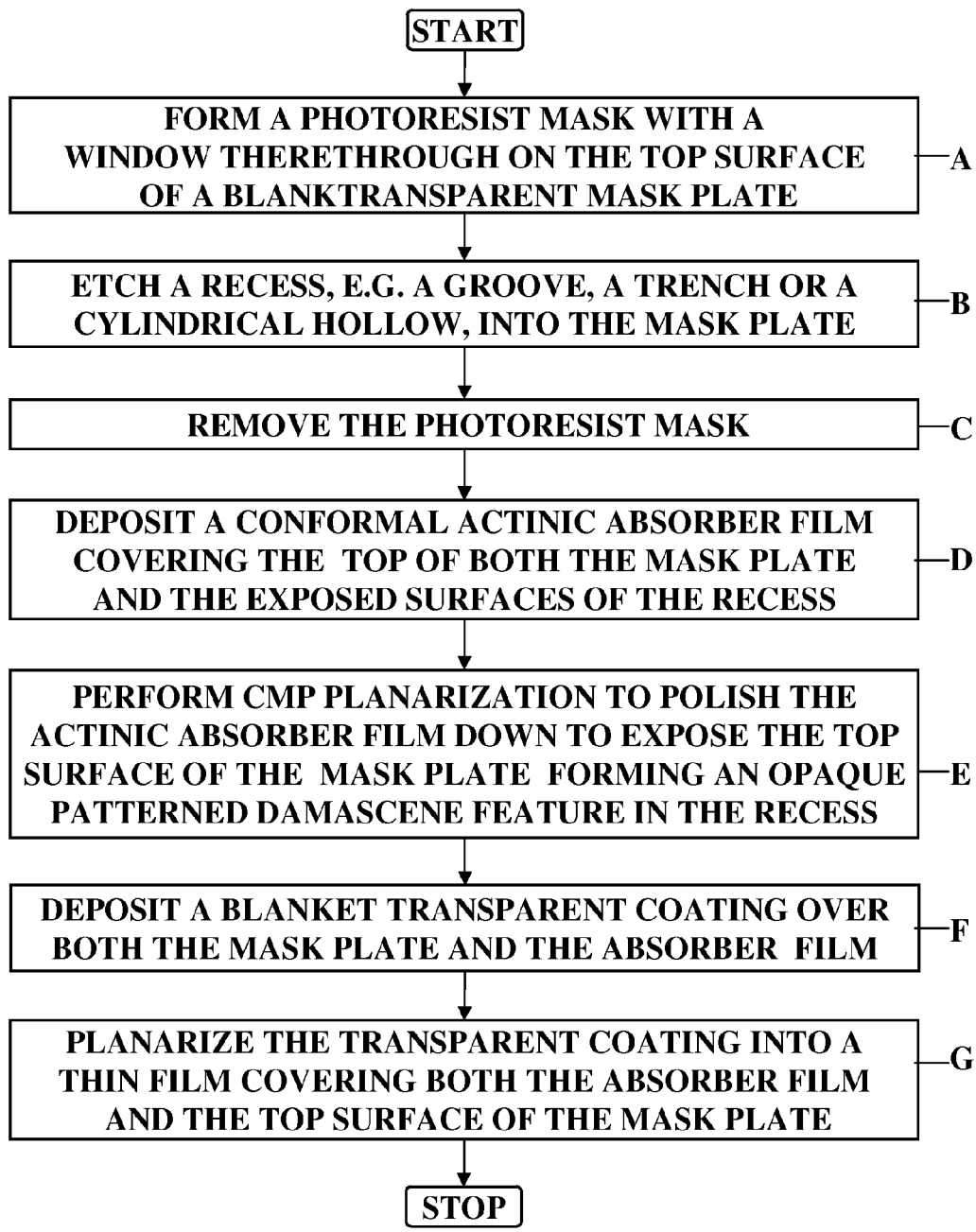
FIG. 2A shows a flow chart which describes the steps in accordance with the process flow illustrated by the drawings from FIG. 1A to FIG. 1G.

The invention has a number of different embodiments. A common feature of the various embodiments is the use of the Damascene Reticle CMP (DRCMP) in the formation of a damascene reticle. Another feature common to all of the different embodiments is the formation of recessed trenches in a transparent plate.

Damascene Quartz Binary Reticle

In this embodiment, a damascene reticle in accordance with the invention is formed employing photolithography. Structures are formed in and/or upon a reticle starting with a blank, planar, transparent reticle mask plate adapted for creating features for use in processes in the manufacture of microelectronic devices.

First Embodiment of a Damascene Mask Plate Formed in a Transparent Reticle Mask Plate Heretofore, mask plate reticles have been formed by patterning opaque material on the top surface of a transparent substrate. In accordance with this invention a damascene mask plate is formed by first forming a pattern of recesses in a blank, transparent, reticle mask plate. Then the recesses are filled with opaque and/or partially transmissive materials depending upon which type of damascene mask plate is being formed in accordance with this invention. Several embodiments thereof are described below with reference to the appended drawings. The substrate can be selected to be transparent for an exposure radiation of an appropriate wavelength to be used with such mask plate reticles. FIGS. 1A-1F are schematic, elevational sections of a reticle 10 formed from a blank transparent reticle mask plate 11 (hereinafter mask plate 11). The process of manufacture provides a patterned damascene reticle 10 shown in FIG. 1G formed in accordance with the method of this invention. FIG. 2 is a flow chart which describes the steps of the process flow illustrated by FIGS. 1A to 1G. FIG. 1G shows a complete, patterned damascene reticle 10 in accordance with this invention after completion of the manufacture thereof. The damascene reticle 10 (mask) of FIG. 1G is adapted to be employed to expose patterns formed thereon.

FIG. 1A shows the blank reticle 10 in the form of a blank, planar, transparent, reticle mask plate 11, hereinafter mask plate 11, (composed of quartz or silicon dioxide) in the initial stage of processing of step A in FIGS. 2A and 2B with a photoresist mask PR formed thereon. The mask plate 11 has a top surface upon which a blanket layer of photoresist PR is deposited and patterned into a mask PR. The mask PR is formed in accordance with photolithographic techniques, well understood by those skilled in the art. There is an open window W reaching down through the mask PR exposing the top surface of the reticle mask plate 11, as will also be well understood by those skilled in the art. The mask plate 11 may comprise a virgin, planar quartz plate with no layer of chrome formed thereon. The top surface of the mask plate 11 is substantially flat or planar. Preferably, the photoresist mask PR may comprise a standard state-of-the-art DUV resist.

FIG. 1B shows the previously blank reticle 10 of FIG. 1A after initial patterning by etching through the window W down into the blank mask plate 11 to form an initial feature recess 12 in the form of a trench formed in the mask plate 11 according to step B in FIGS. 2A/2B. The initial feature recess 12 extends down partially through the mask plate 11 from the top surface of reticle mask 10. The initial feature recess 12 can be formed in a quartz or silicon dioxide mask plate 11 by using a conventional etching process, using either a wet etching or a dry etching process. For quartz or glass (silicon oxide) a wet etch can be performed with an acidic etchant, e.g. an aqueous hydrofluoric acid (HF) solution. A dry etch can be performed by Reactive Ion Etching (RIE) with a dry etchant such as $CF_4$. TetraMethylAmmonium Hydroxide (TMAH) which is a base can etch the initial feature recess 12 into a silicon mask plate 11. TMAH is a quaternary ammonium salt with the molecular formula $(CH_3)_4NOH$ used as an anisotropic etchant of silicon; and TMAH can be used as a basic solvent in the development of an acidic photoresist in photolithographic processing of a workpiece.

FIG. 1C shows the reticle 10 of FIG. 1B after the photoresist mask PR is removed from the top of the patterned, mask plate 11 in accordance with step C in FIG. 2.

FIG. 1D shows the reticle 10 of FIG. 1C after deposition of a radiation transmissivity modifying material on the top surface of the etched mask plate 11. In this case the radiation transmissivity modifying material comprises a conformal, opaque-absorber film 15C composed of an opaque material with a relatively uniform thickness. The absorber film 15C is deposited on the top surface of the mask plate 11 and the sidewall and bottom surfaces of the initial feature recess 12 in accordance with step D in FIG. 2. The conformal, opaque-absorber film 15C leaves a recess 15R defining a shallower and narrower feature recess 12' (representing a latent feature 15F.) The absorber film 15C preferably comprises an opaque material selected to have optical characteristics adapted to block the radiation (e.g. light) which can be employed for exposure (onto workpieces being manufactured) of patterns of damascene features to be formed in the mask plate 11. One such damascene feature 15F is shown after completion of processing thereof as shown by FIG. 1G.

FIG. 1D shows how a mask plate 11 is being prepared to be patterned with the feature 15F of FIG. 1E. After step D is completed the initial feature recess 12 is narrowed (forming a potential, damascene feature 15R) by the thickness of the conformal, absorber film 15C which lines the sidewall surfaces as well as the bottom surface of the initial feature recess 12 of FIG. 1B. In other words a narrowed feature recess 12' remains inside the initial feature recess 12. It is preferred to employ Chemical Vapor Deposition (CVD) to deposit the absorber film 15C when it comprises TaN, Ta, Ti, TiN, Ni, W, $SiO_2$, SiN, or SiC or a combination thereof. Other deposition techniques can also be employed to deposit film 15C, e.g. plating, atomic layer deposition, sputtering, evaporation, etc. that are all well known in the industry.

FIG. 1E shows reticle 10 of FIG. 1D after planarization by a process such as DRCMP in step E of FIGS. 2A/2B to remove the uppermost (outer), exposed portions of the conformal layer of opaque material 15C from the top surface of the mask plate 11. The inner, remainder of the conformal layer of opaque material 15P is formed into a patterned, opaque, damascene feature 15F which remains on the sidewall surfaces and the bottom surface of the initial feature recess 12 of FIG. 1E leaving a shallower feature recess 12".

FIG. 1F shows the reticle 10 of FIG. 1E after a deposition in accordance with step F in FIG. 2A of a blanket transparent coating 16B that will allow mask exposure, radiation, i.e. light, to pass through it and through the mask plate 11 as well, aside from the patterned, opaque, damascene feature 15F. The transparent coating 16B covers the top surface of the mask plate 11 and fills the shallower feature recess 12" leaving the surface of the transparent coating 16B with a depression 16D therein above the shallower feature recess 12" of FIG. 1E. It is preferred to deposit the transparent coating 16B by a CVD process. Alternatively, one can sputter and spin-on materials which are used as insulators (i.e. SiLK from Dow Chemical and flowable oxides) which can be deposited to form the transparent coating 16B. These spin-on materials are applied in the same manner as photoresist. Additionally, if a spin-on component, is used, it can be planarized. The planarizing characteristics are dependant upon the viscosity of the material, as is well known by those skilled in the art.

FIG. 1G shows the completed reticle 10 of FIG. 1F after a step of planarization, e.g. DRCMP planarization in accordance with step G in FIG. 2A. The DRCMP planarization of step G has transformed the blanket layer of transparent material 16B of FIG. 1F into a thin film 16P of FIG. 1G comprising a planar remainder of the transparent coating 16B with a substantially planar top surface. The planar transparent coating 16P continues to fill the shallower feature recess 12" and covers the top surface of the reticle mask plate 11, providing protection for the remainder of the conformal layer of opaque material 15P (which forms the patterned, opaque, damascene feature 15F) and the reticle mask plate 11.

Figure 2B:
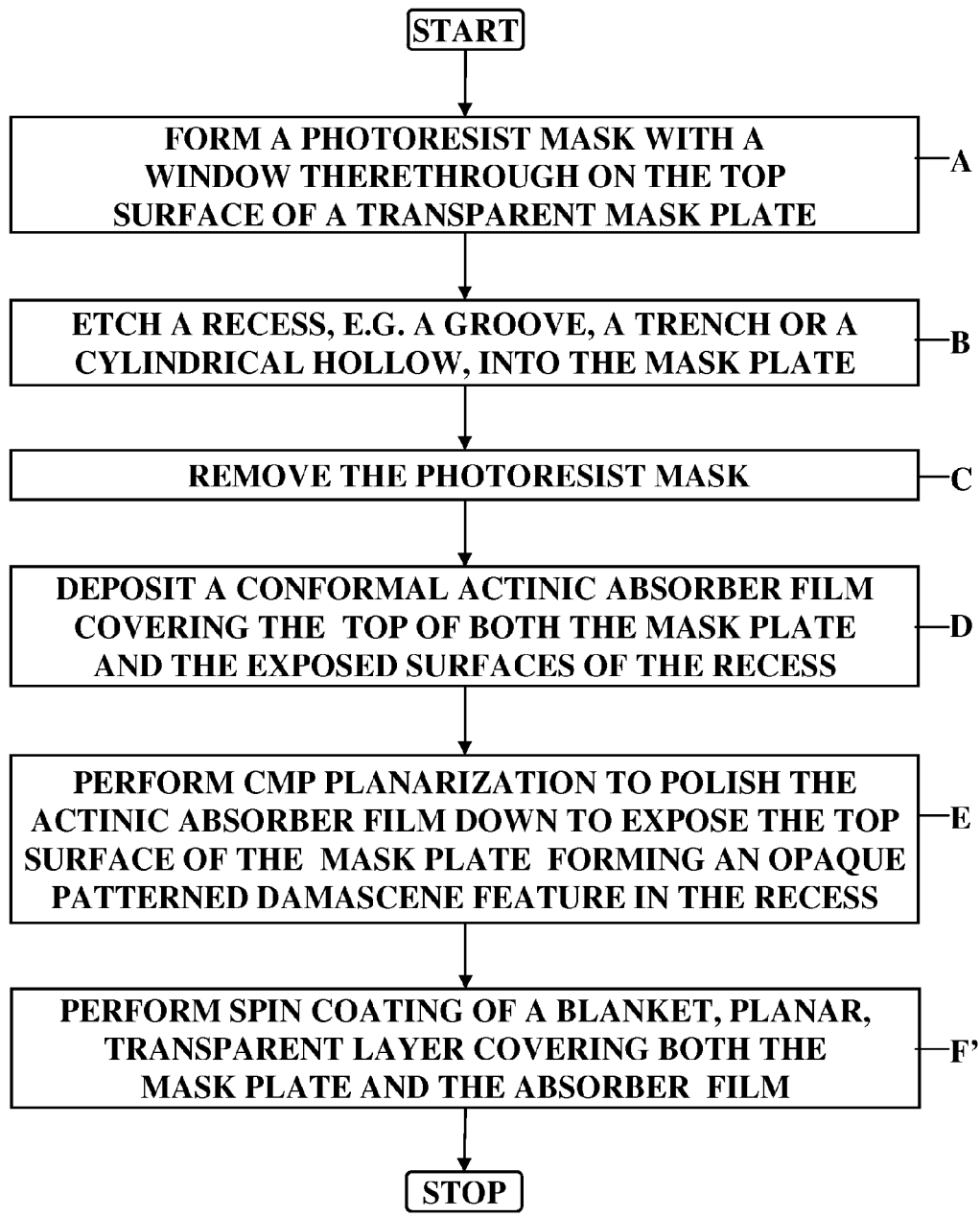
FIG. 2B shows a flow chart which describes alternative steps in accordance with the process flow illustrated by the drawings from FIG. 1A to FIG. 1G.

Alternatively in FIG. 2B, steps F and G have been replaced by step F' in which spin coating a deposit of a blanket, planar, transparent layer 16P (as shown in FIG. 1G) covers both the mask plate 11 and the patterned, opaque, damascene feature 15F formed from the absorber film 15C.

In the processing in accordance with FIGS. 2A and 2B, it is preferable to deposit the layers by Chemical Vapor Deposition (CVD), where applicable.

Second Embodiment

Damascene PSM Reticle

Figure 4:
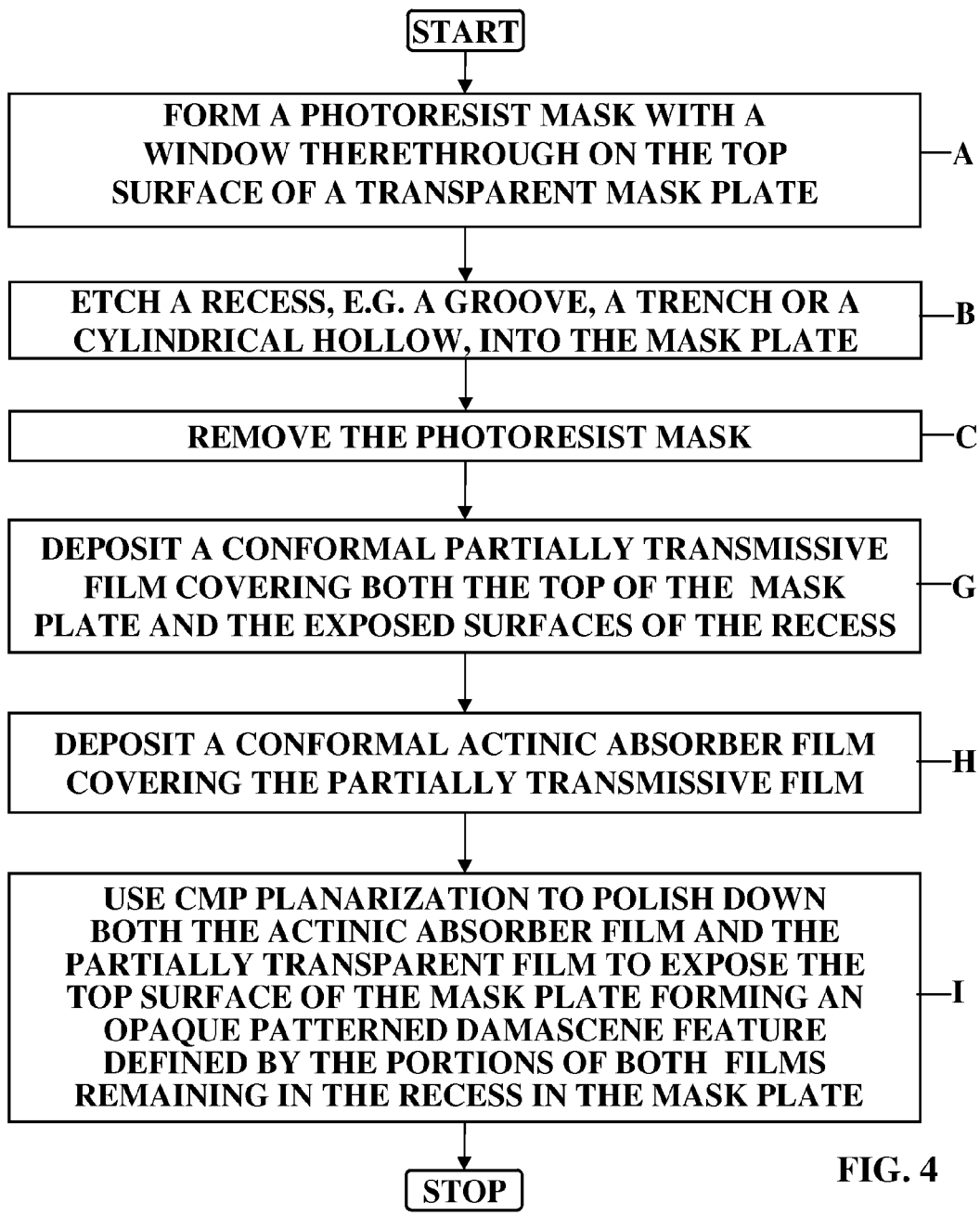
FIG. 4 is a flow chart which describes the steps in accordance with the process flow illustrated by the drawings from FIG. 3A to FIG. 3F.

FIGS. 3A-3F are schematic elevational views of a damascene PSM reticle 30 during the process of manufacture of the reticle in accordance with another aspect of the method of this invention, as shown by the flow chart of FIG. 4. FIGS. 3A-3F illustrate process flow for patterning the reticle 30. As shown in FIG. 3F, the resulting reticle 30 has PSM features 36F' which are composed of deposited conformal film elements 33P/35P filling a feature recess 32 in a mask plate 31. The reticle 30 is adapted to be used to expose patterns on a workpiece (not shown.) FIG. 3F shows a patterned reticle 30 which is to be employed as a PSM mask after the manufacture thereof in accordance with this invention for exposing patterns formed thereon.

FIG. 3A shows the reticle 30 in an initial stage of processing in accordance with step A in FIG. 4. A transparent reticle mask plate 31 (hereinafter mask plate 31) is shown with a top surface on which a photoresist mask PR is formed. As with FIG. 1A, an open window W through photoresist mask PR reaches down to the top surface of the mask plate 31, which may comprise a virgin, planar quartz plate with no layer of chrome formed thereon. The top surface of the mask plate 31 is flat or planar.

FIG. 3B shows the reticle 30 of FIG. 3A after an initial feature recess 32 was etched into the top surface of the mask plate 31 in accordance with step B in FIG. 4. In step B, the reticle mask plate 31 is etched with a conventional etching process, as described above with reference to step B in FIG. 2.

FIG. 3C shows the reticle 30 of FIG. 3B after removal of photoresist mask PR from the top surface of the mask plate 31 according to step C in FIG. 4.

FIG. 3D shows the reticle 30 of FIG. 3B after deposition of a radiation transmissivity modifying material, which in accordance with step G in FIG. 4 comprises a conformal, partially-transmissive film 33C (i.e. partially-transparent film). The partially-transmissive film 33C is deposited on the top surface of the reticle 30 and the sidewalls and the bottom surface of the etched initial feature recess 32 leaving a narrower feature recess 32' (forming a potential, damascene feature 33R) representing a stage in the patterning of a feature 36F' shown in FIG. 3F. The conformal, partially-transmissive film 33C is selected to have optical characteristics adapted to provide partial blocking of the radiation (e.g. light) that can be employed for exposure (onto workpieces being manufactured) of patterns of features 36F formed on the reticle 10. In FIG. 3F the feature 36F' is shown after completion of processing of the device 30 by step I in FIG. 4 of CMP planarization to polish down both the actinic absorber film 35C and the partially-transmissive film 33C (i.e. partially-transparent film) to expose the top surface of the mask plate 31 forming an opaque patterned damascene feature 36F' defined by the portions of both films remaining in the recess in the mask plate reticle 10.

Summarizing, when step G in FIG. 4 is completed the initial feature recess 32 is narrowed into narrower feature recess 32' and reduced in depth by the thickness of the partially-transmissive film 33C which lines the sidewall surfaces and the bottom surface of the etched initial feature recess 32 of FIG. 3C forming the potential, damascene feature 33R. In other words a narrowed feature recess 32' remains inside the etched initial feature recess 32 which is lined with the partially-transmissive film 33C.

FIG. 3E shows the patterned reticle 30 of FIG. 3D after a conformal, actinic/light blocking, opaque-absorber film 35C is formed thereover in accordance with step H in FIG. 4. Thus, both laminated films 33C/33R including the partially-transmissive, conformal film 33C and the conformal, opaque-absorber film 35C cover the reticle 30. The opaque-absorber film 35C is deposited over the patterned reticle 30 with a relatively uniform thickness on the top surface of the partially-transmissive film 33C including the sidewall and bottom surfaces of the feature recess 32'. As a result, the opaque-absorber film 35C produces a potential feature 36F in the even narrower feature recess 32". The conformal, opaque-absorber film 35C preferably comprises an opaque material selected to have optical characteristics adapted to block the radiation (e.g. light) which can be employed for exposure (onto workpieces being manufactured) of patterns of damascene features to be formed in the mask plate 11. One such damascene feature 36F' is shown after completion of processing thereof as shown by FIG. 3F.

FIG. 3F shows the reticle 30 of FIG. 3E after the step I in FIG. 4 of planarization of the two laminated films 35C/33C down to the top surface of the mask plate 31. The initial feature recess 32 remains lined with the damascene PSM feature 36F composed of the combination of a remainder element 33P from partially-transmissive film 33C and a remainder element 35P from opaque-absorber film 35C (nested in remainder element 33P) which form the resulting damascene feature 36F'. In step I of FIG. 4 the conformal, opaque-absorber, actinic or light blocking film 35C, and the conformal partially-transmissive film 33C are polished away from the top of the reticle mask plate 31 by CMP planarization forming the damascene PSM Reticle 30. Thus, the resulting feature 36F' comprises the laminated combination of the remaining conformal partially-transmissive remainder film 33P which lines the sidewalls and bottom surface of the initial feature recess 32 and the remaining conformal, opaque-absorber film 35P which lines the conformal partially-transmissive remainder film 33P in the feature recess 32, leaving a shallower, narrowed feature recess 32" within the opaque-absorber remainder film 35P.

The blanket films 33C/35C may be composed of a material selected from Silicon Oxide ($SiO_2$), Silicon Nitride ($Si_3N_4$), and chromium (Cr) may be deposited on the reticle mask plate 31. These are known materials and offer options of not just passing light, but also changing the light. Those changes in the light can be employed to provide attenuation or phase shifting.

Third Embodiment

Damascene PSM Reticle In-Situ Lens Formation on the Reticle

In a modification of the embodiment of FIG. 3F, aside from the detail that the shape and index of refraction of the outer, partially-transmissive, remainder element 33P is tuned so that parallel, focused light beams come out of the top side of the reticle 30 as illumination is to be projected from below for all images. Improvements can employ multiple different layers with varying refraction indexes to improve the focus effect.

Fourth Embodiment

Via Feature

Figures 5, 18:
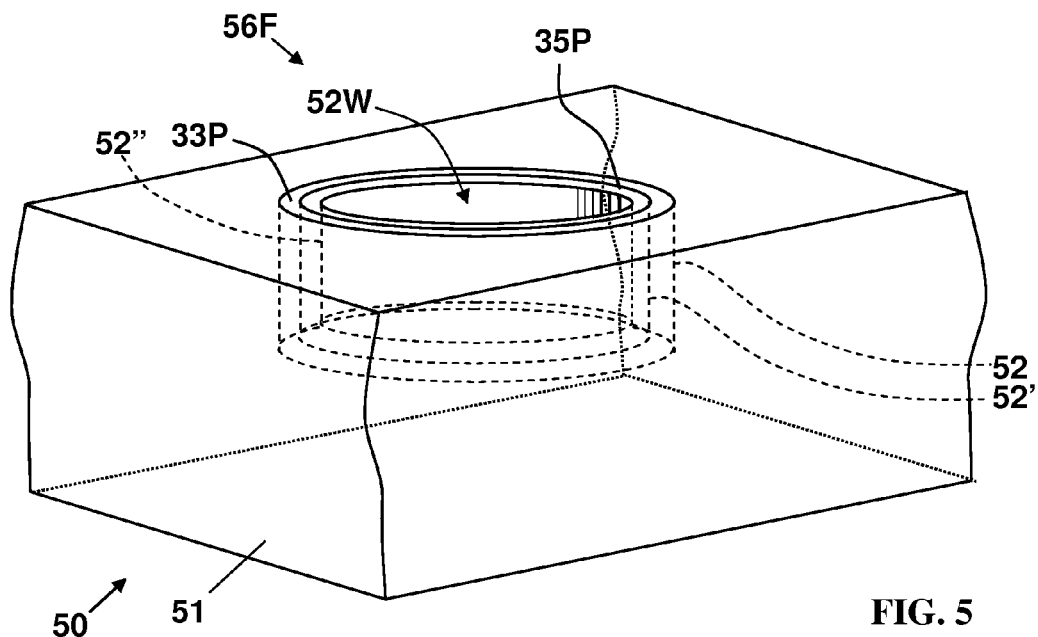
FIG. 5 is a perspective view depicting a reticle in accordance with this invention in which an annular, via type via feature is formed for a structure, e.g. a semiconductor via, in a transparent reticle mask plate.
FIG. 18 is a table showing transparent materials and their refractive indices.

FIG. 5 is a top perspective view depicting a reticle 50 in accordance with this invention in which an annular, via type via feature 56F is formed for a structure, e.g. a semiconductor via, in a mask plate 51. The reticle 50 is made in accordance with the method of this invention, as shown by the FIG. 4 flow chart. In this case, as in FIGS. 3B and 3C and steps B and C in FIG. 4, a cylindrical initial feature recess 52 is formed in the reticle mask plate 51 by etching down into the mask plate 51. Then the initial feature recess 52 is lined with a conformal light passing film 33P (deposited as in FIG. 3D, according to step G in FIG. 4) which forms a narrower cylindrical recess 52'. Next the additional narrower cylindrical recess 52' is lined with a conformal light blocking film 35P (deposited as in FIG. 3E, according to step H in FIG. 4) covering the sidewalls and bottom thereof. Then a planarization step I in FIG. 4 is performed producing a via patterning feature 56F. A hollow well 52W remains inside the conformal light blocking film 35P.

Fifth Embodiment

Line Feature

Figure 6:
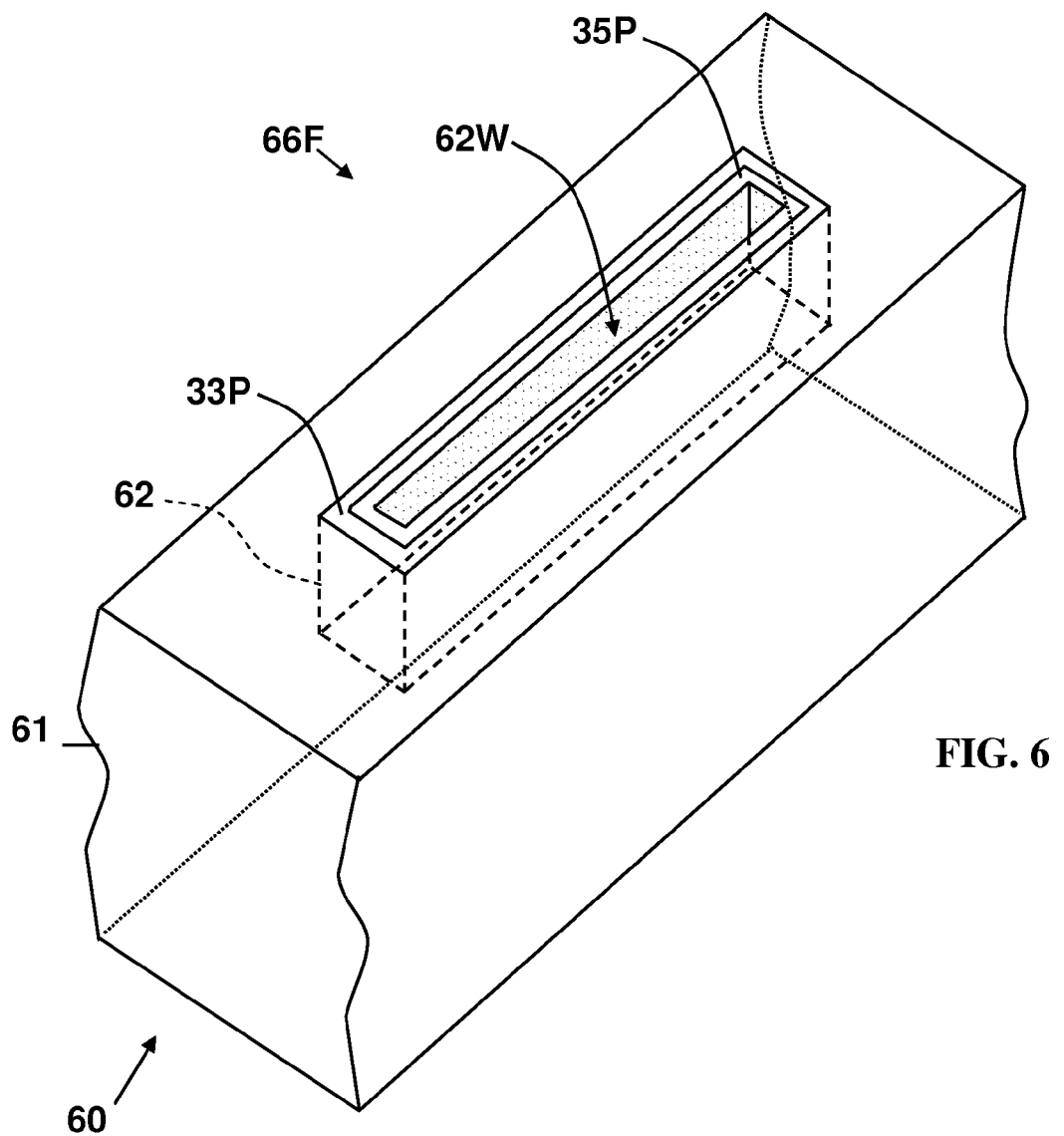
FIG. 6 shows a perspective view depicting a reticle in accordance with this invention in which an rectangular type line patterning feature is shown in a transparent reticle mask plate with the light passing material and the light blocking material formed in a linear feature recess leaving a narrow feature recess inside the light blocking film.

FIG. 6 shows a top perspective view depicting a reticle 60 in accordance with this invention in which an rectangular type line patterning feature 66F is shown in a transparent reticle mask plate 61 (hereinafter mask plate 61) with the light passing material 33P and the light blocking 35P material formed in a linear feature recess 62 leaving a narrow feature recess 62W inside the light blocking film 35P. The reticle 60 is made in accordance with the method of this invention, as shown by the flow chart of FIG. 4. In this case, as in FIGS. 3B and 3C, the rectangular initial feature recess 62 is etched into the mask plate 61. Then the rectangular initial feature recess 62 is lined with a conformal light passing film 33P (deposited as in FIG. 3D, according to step G in FIG. 4) forming a narrower rectangular recess. Next the additional narrower rectangular recess is lined with a conformal light blocking film 35P (deposited as in FIG. 3E according to step H in FIG. 4) covering the sidewalls and bottom of the additional narrower rectangular recess. Then the planarization step I in FIG. 4 produces line patterning feature 66F. Thus the hollow well 62W remains inside the conformal light blocking film 35P. In summary, the line patterning feature 66F was formed in the rectangular initial feature recess 62.

Sixth Embodiment

Light Blocking Material Embedded in a Reticle

Figure 7A:
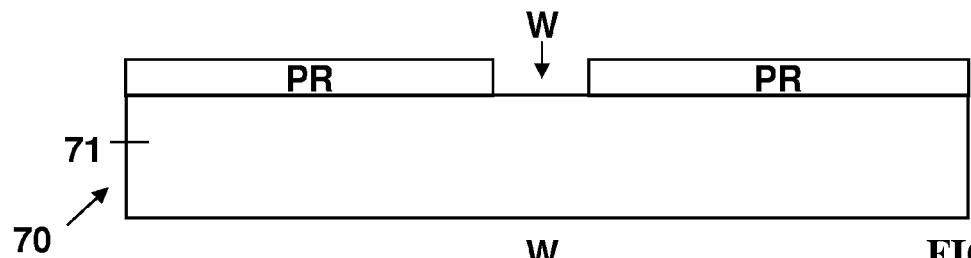
FIGS. 7A-7F illustrate an alternative process of manufacture which provides a patterned damascene reticle in accordance with the method of this invention.
Figure 7B:
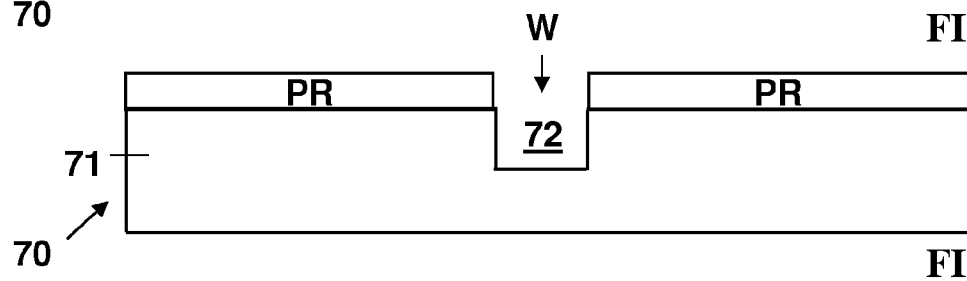
Figure 7C:
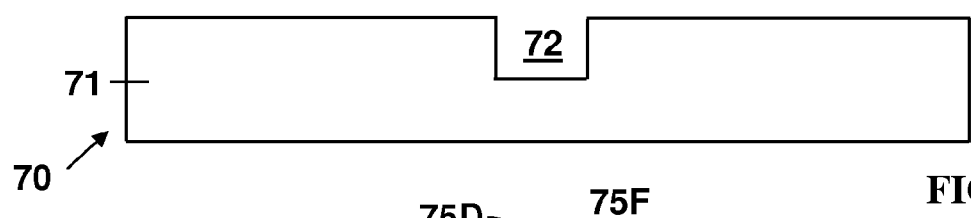
Figure 7D:
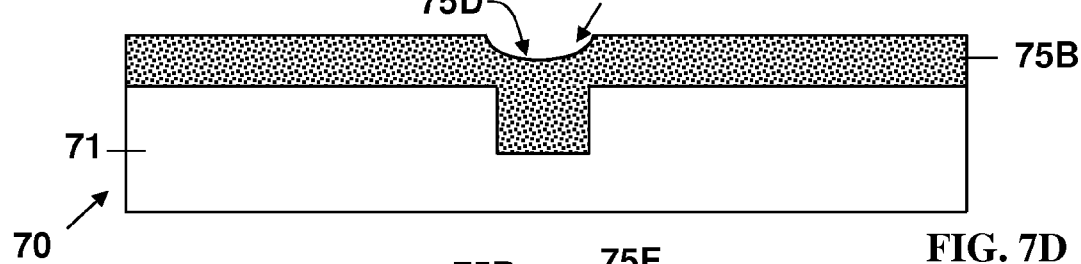
Figure 7E:
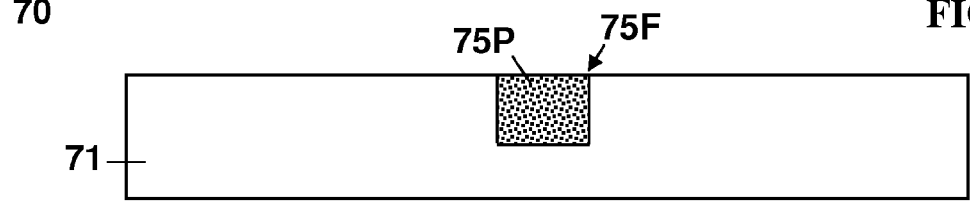
Figure 7F:
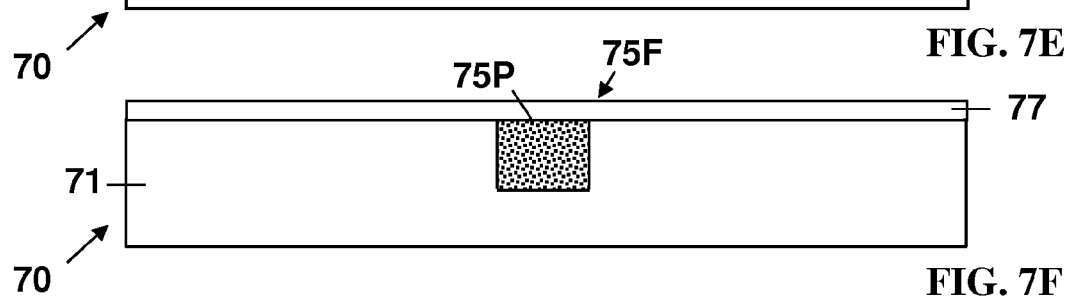
Figure 8:
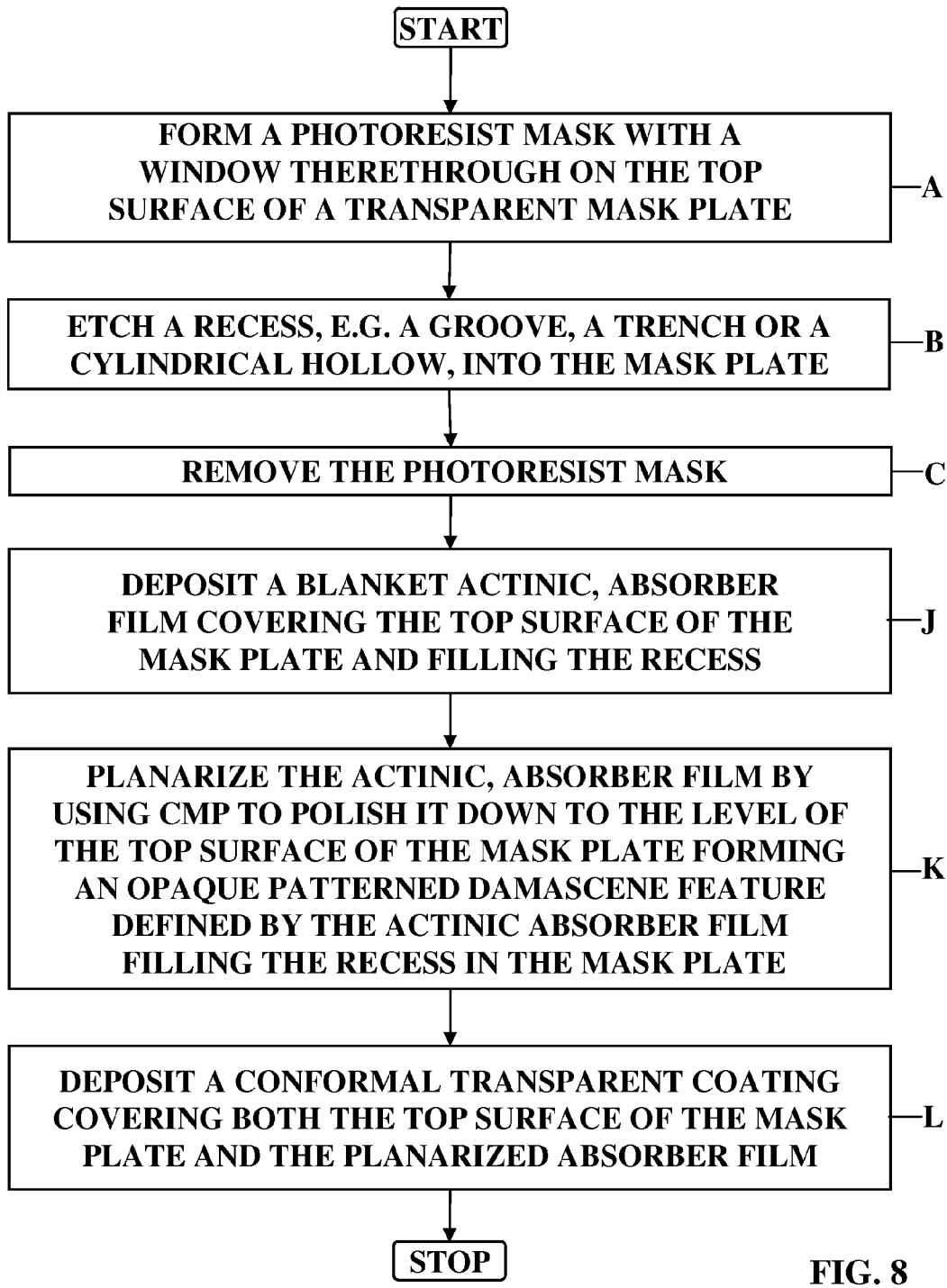
FIG. 8 is a flow chart which describes the steps of the process flow illustrated by the drawings from FIG. 7A to FIG. 7F.

FIGS. 7A-7F are schematic elevational views of the steps of forming a reticle 70 from a blank, transparent, reticle mask plate 71 (hereinafter mask plate 71) illustrating an alternative method of manufacture of a patterned damascene reticle 70 in accordance with the method of this invention. FIG. 7F shows a complete, patterned damascene reticle 70 in accordance with this invention after completion of the manufacture thereof. In FIG. 7F a fully opaque feature 75F is embedded in a feature recess 72 in the mask plate 71 of the reticle 70. FIG. 8 is a flow chart which describes the steps of the process flow illustrated by the drawings from FIG. 7A to FIG. 7F. The damascene reticle 70 (mask) of FIG. 7F is adapted to be employed to expose patterns formed thereon.

In FIG. 7A, the process begins with a blank, planar, transparent reticle mask plate 71 in an initial stage of processing in accordance with step A in FIG. 8 with a photoresist mask PR formed thereon. The mask plate 71 (composed of quartz or silicon dioxide) has a top surface upon which a blanket layer of photoresist PR is deposited and then patterned into a photoresist mask. The mask PR is formed in accordance with photolithographic techniques which are well understood by those skilled in the art. There is an open window W reaching down through the photoresist mask PR exposing the top surface of the mask plate 71, as will also be well understood by those skilled in the art. The transparent reticle mask plate 71 may comprise a virgin, planar quartz plate with no layer of chrome formed thereon. The top surface of the mask plate 71 is substantially flat or planar. Preferably, the photoresist mask PR comprises a standard DUV resist.

FIG. 7B shows the previously blank reticle 70 of FIG. 7A after initial patterning by etching through the window W down into the blank mask plate 71 to form a feature recess 72 in the form of a trench formed in the mask plate 71 extending down from the top surface of the mask plate 71 in accordance with step B in FIG. 8. In step B, the feature recess 72 can be formed in a quartz or silicon dioxide, mask plate 71 by etching the feature recess employing a conventional etching process; or by using either a wet etching or a dry etching process as described above.

FIG. 7C shows the reticle 70 of FIG. 7B in accordance with step C in FIG. 8, after the photoresist mask PR is removed from the top surface of the mask plate 71 in accordance with step C in FIG. 8.

FIG. 7D shows the reticle 70 of FIG. 7C after deposition of a blanket, opaque-absorber film 75B composed of an opaque material with a relatively uniform thickness on the top surface of the mask plate 71, which fills the feature recess 72 in accordance with step J in FIG. 8, leaving a depression 75D over the feature recess 72. The opaque material of the absorber film 75B, which preferably has optical characteristics adapted to block the radiation (e.g. light), can be employed for exposure (onto workpieces being manufactured) of patterns of damascene features to be formed in the mask plate 71. One such damascene feature 75F is shown after completion of processing thereof as shown by FIG. 7G. The layer 75B is opaque to the actinic wavelength and completely fills up the feature recess 72, which is a patterned trench.

FIG. 7E shows the reticle 70 of FIG. 7D after a planarization step such as DRCMP to remove the outer, exposed portions of the blanket opaque absorber film 75B from the top surface of the mask plate 71 in accordance with step K in FIG. 8. The inner, remainder 75P of the blanket, opaque absorber film 75B is formed into a patterned, opaque, damascene feature 75F remaining in the feature recess 72 of FIG. 7E.

FIG. 7F shows the completed reticle 70 of FIG. 7E after deposition in accordance with step L in FIG. 8 of a blanket, transparent coating film 77 covering the remainder 75P of the film 75B (i.e. the patterned, opaque, damascene feature 75F) and the top surface of the mask plate 71. The transparent coating film 77 allows mask exposure, radiation, i.e. light, to pass through it through the mask plate 71 as well, aside from the patterned, opaque, damascene feature 75F. The transparent coating 77 provides protection from use or handling by encapsulating the remainder of the opaque absorber film 75P (which forms the patterned, opaque, damascene feature 75F) and the mask plate 71.

Eighth Embodiment

Encapsulated Materials and Variable Index of Refraction

FIGS. 9A-9I illustrate the steps of a method of manufacture of a reticle mask 100 patterned with feature recesses in accordance with this invention. FIGS. 10A/10B show a flow chart of the processing steps shown by FIGS. 9A to 9I.

Figure 9A:
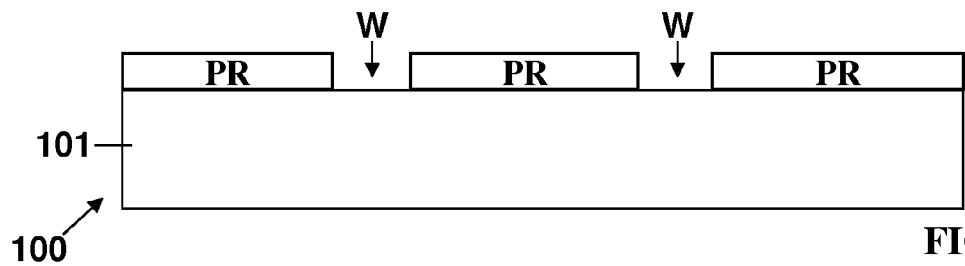
FIGS. 9A-9I illustrate the steps of a method of manufacture of a reticle mask plate which is patterned with feature recesses in accordance with this invention.
Figure 9B:
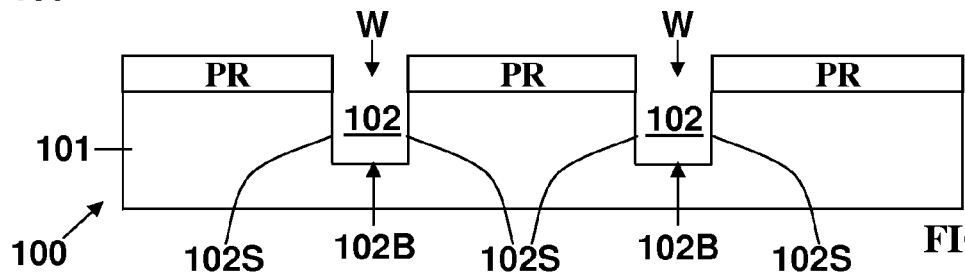
Figure 9C:
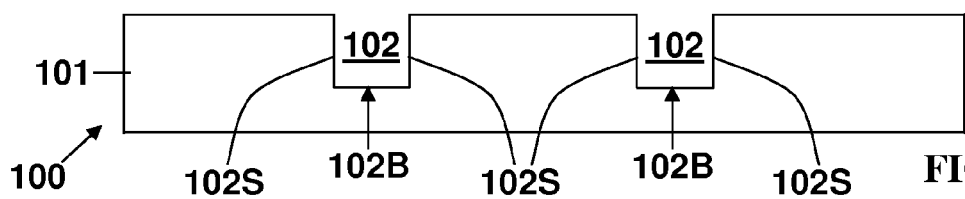
Figure 9D:
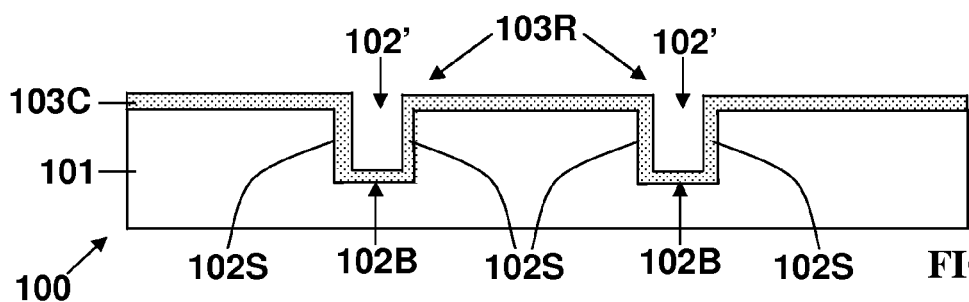
Figure 9E:
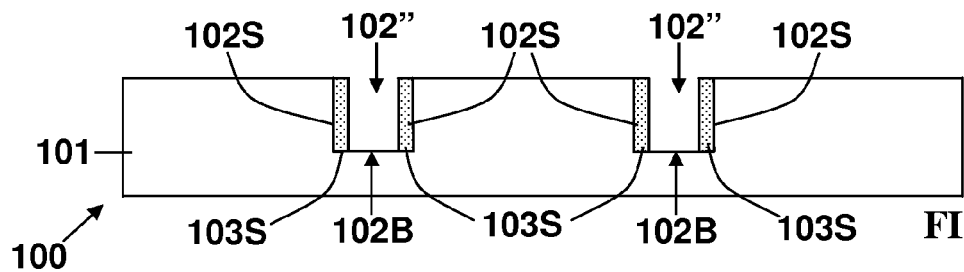

In the method of FIGS. 9A-9I and the flow chart of FIGS. 10A/10B, a reticle 100 is formed in a transparent reticle mask plate 101 (hereinafter mask plate 101) shown in FIG. 9A. Pattern the mask plate 101 with feature recesses 102 with sidewall surfaces 102S and bottom surfaces 102B (FIGS. 9B/9C). Then deposit a conformal sacrificial film 103C covering exposed surfaces on the top of the patterned mask plate 101 including the exposed surfaces 102S/102B forming narrowed feature recesses 102' (FIG. 9D.) Next etch back the conformal sacrificial film 103C is using an anisotropic inside spacer process that leaves recessed sacrificial film sidewalls 103S on the sidewalls 102S, while exposing the bottom surfaces 102B forming deepened narrowed feature recesses 102" (FIG. 9E.)

Then deposit a conformal opaque film 105C (FIG. 9F), covering exposed surfaces including the bottom surfaces 102E forming a pair of preliminary features 105R with narrower and shallower feature recesses 102'". Then in a DRCMP step, remove the external portion of the conformal opaque film 105C from the top surface of the reticle 100 (FIG. 9G) forming modified features 105F with shallower recesses 102F. Next, remove the recessed portions of the sacrificial film 103S leaving gaps 107O between the sidewalls 102S and the features 105F (FIG. 9H). The gaps 107O can be filled, preferably with a gas or generation of a vacuum employing conventional equipment as will be well understood by those skilled in the art. If a gas is used it is preferable to fill the gap 107O with an inert gas to prevent unwanted reactions with the solid materials. Finally deposit a protective capping layer 109 over the features 105F. At this point a planarizing step can be performed (not shown) if needed.

FIG. 9A shows the reticle 100 in an initial stage of processing according to step A in FIG. 10A. A blank mask plate 101 is shown with a photoresist mask PR formed thereover. As with FIG. 1A, there are two open windows W through photoresist mask PR down to the top surface of the mask plate 101. The mask plate 101 may comprise a transparent, virgin, planar quartz plate with no layer of chrome formed thereon. The top surface of the mask plate 101 is flat or planar.

FIG. 9B shows the reticle 100 of FIG. 9A after a pair of initial feature recesses 102 having sidewalls 102S and bottom surfaces 102B were etched into the top surface of the mask plate 101 in accordance with step B in FIG. 10A. In step B, the reticle mask plate 101 is etched with a conventional etching process as described above in step B of FIG. 2, exposing the bottom surfaces 102B of the recesses 102.

FIG. 9C shows reticle 100 of FIG. 9B after stripping the photoresist mask PR from the top surface of the mask plate 101 according to step C in FIG. 10A.

FIG. 9D shows reticle 100 of FIG. 9C after deposition according to step M in FIG. 10A of a conformal, sacrificial film 103C on top of the reticle 100 and the sidewalls and the bottom surface of the etched initial feature recess 102 leaving a narrower feature recess 102' representing a initial portion of a feature (feature 105F in FIGS. 9F-9I).

FIG. 9E shows the reticle 100 of FIG. 9D after performing an anisotropic inside spacer etching process in accordance with step N in FIG. 10A removing the horizontally extending regions of the sacrificial film 103C exposing the top surface of the mask plate 101 and the bottom surfaces 102B leaving a pair of narrowed and deeper features 102" and leaving the sacrificial film sidewall spacers 103S on the sidewalls 102S.

Figure 9F:
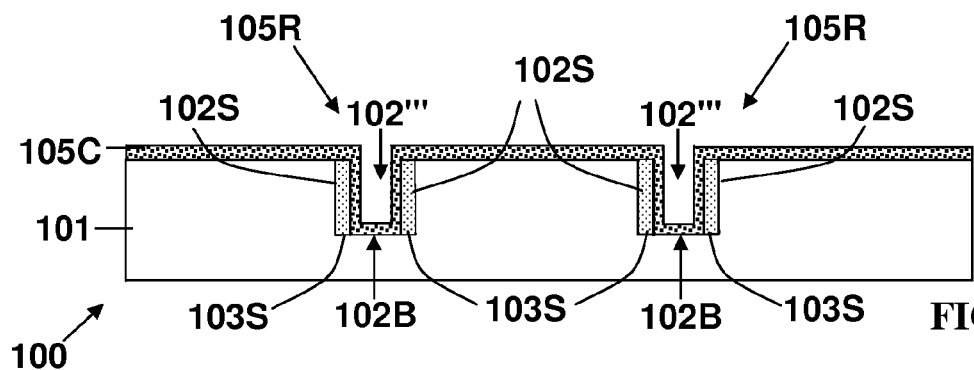
Figure 9H:
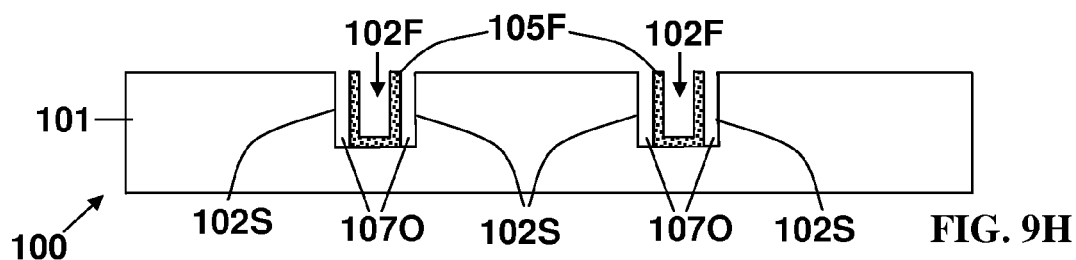
Figure 9I:
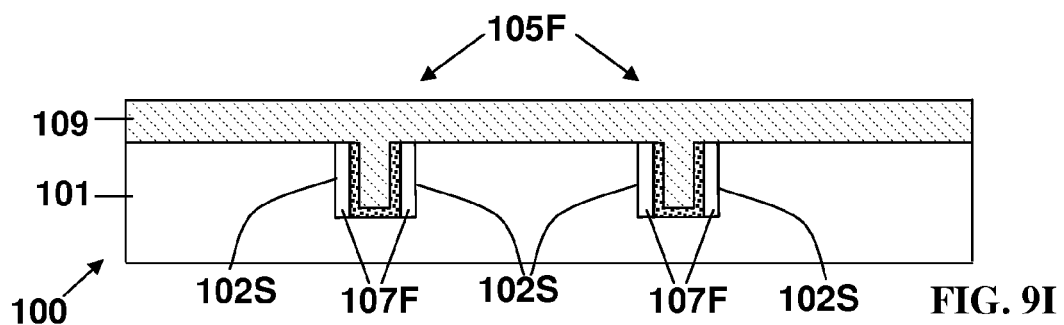
Figure 10A:
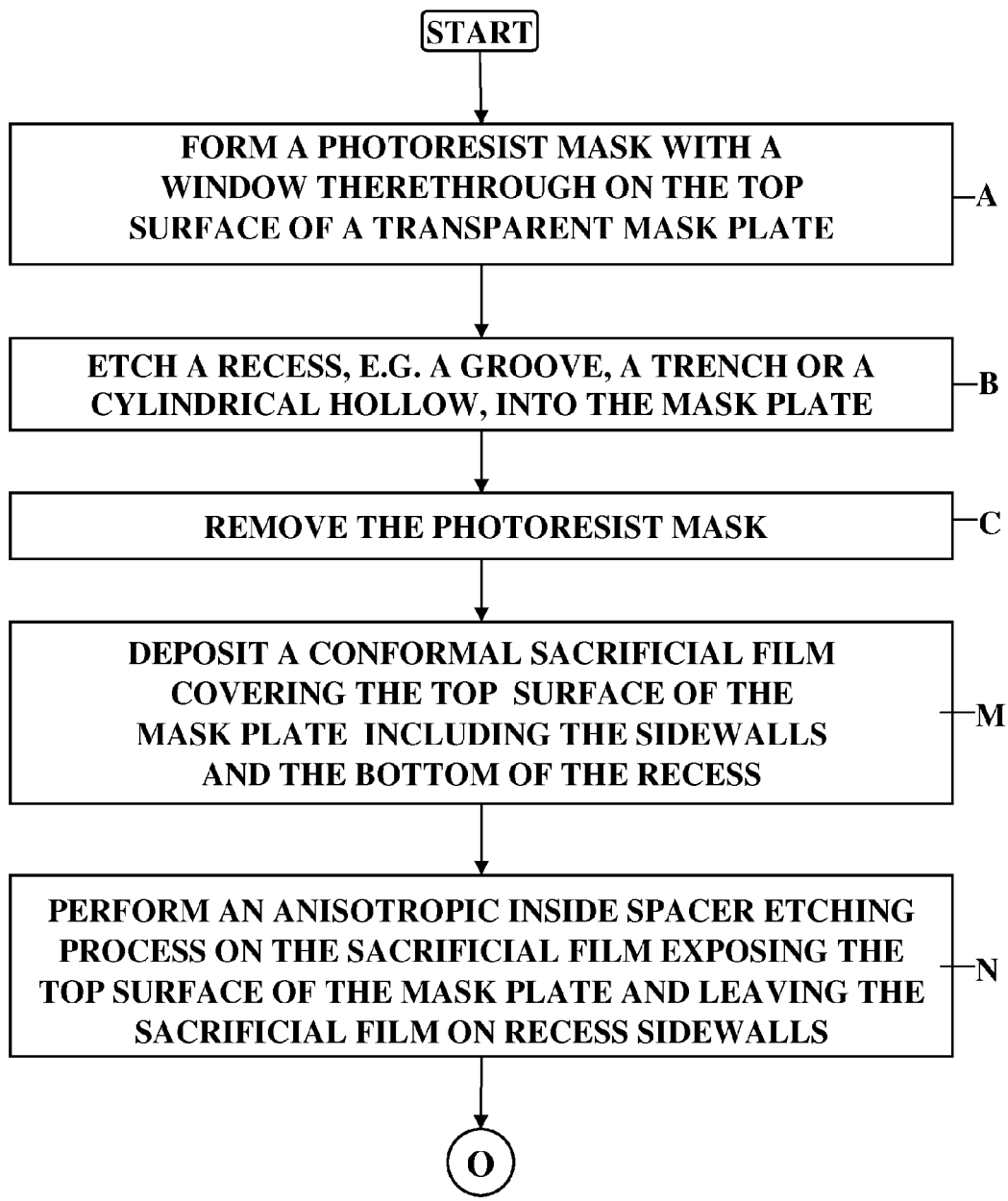
FIG. 10A and FIG. 10B show a flow chart of the steps of the process flow illustrated by the drawings from FIG. 9A to FIG. 9I.
Figure 10B:
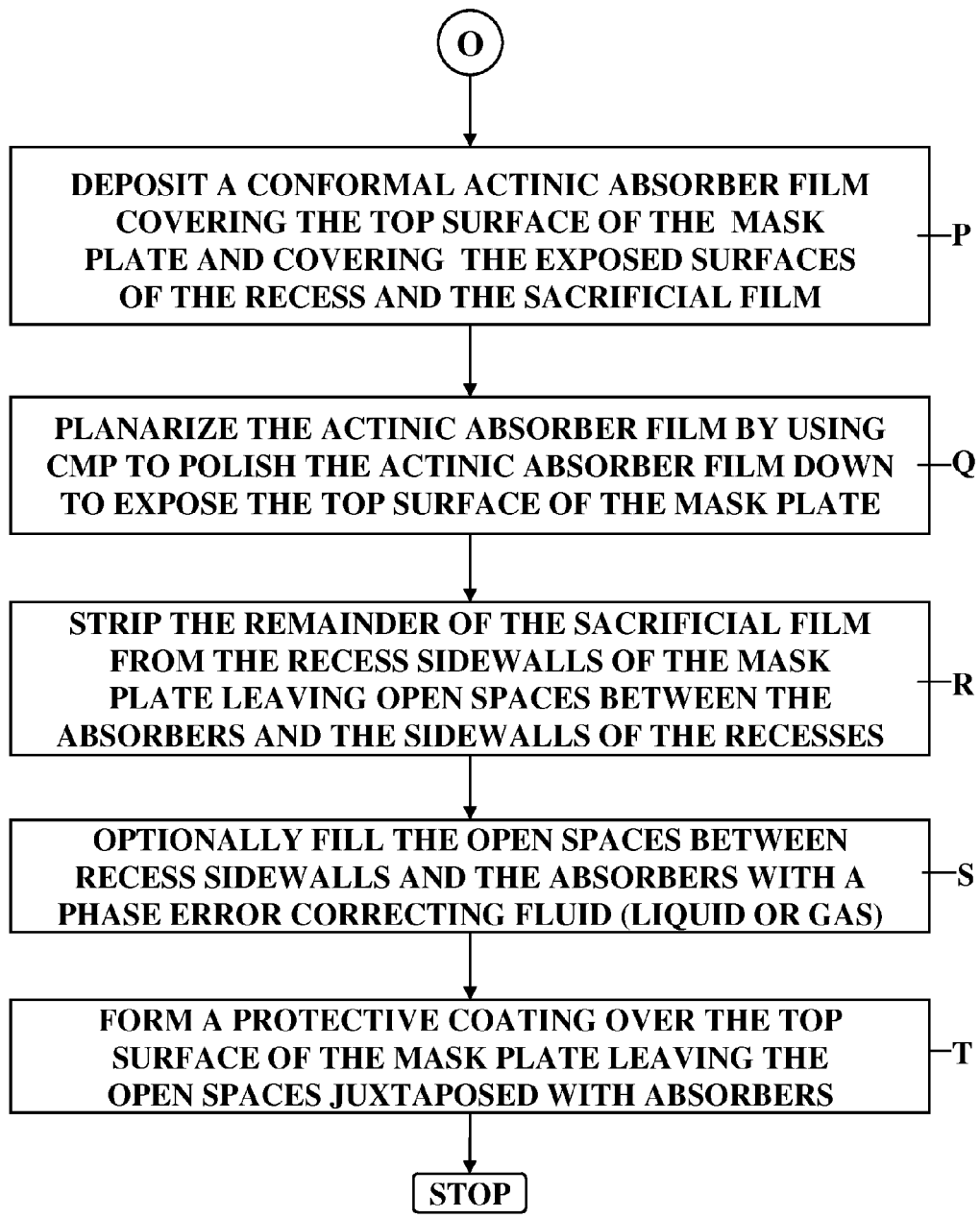

FIG. 9F shows the patterned reticle 100 of FIG. 9E after forming a conformal, actinic/light blocking, opaque-absorber film 105C thereover in accordance with step P in FIG. 10B. The conformal, opaque-absorber film 105C covers the top surfaces of the reticle mask plate 101, the bottom surfaces 102B of both feature recesses 102" and the exposed surfaces of the sacrificial film sidewall spacers 103S. At this point, the opaque-absorber film 105C and sidewall spacers 103S have been deposited within the recesses 102. The opaque-absorber film 105C is deposited over the patterned reticle 100 with a relatively uniform thickness. As a result, the opaque-absorber film 105C produces an even narrower feature recesses 102''' defining preliminary features 105R. The conformal, opaque-absorber film 105C preferably comprises an opaque material selected to have optical characteristics adapted to block the radiation (e.g. light) which can be employed for exposure (onto workpieces being manufactured) of patterns of damascene features to be formed in the mask plate 101. Two such damascene features 105F are shown after completion of processing thereof as shown by FIGS. 9H and 9I.

Figure 9G:
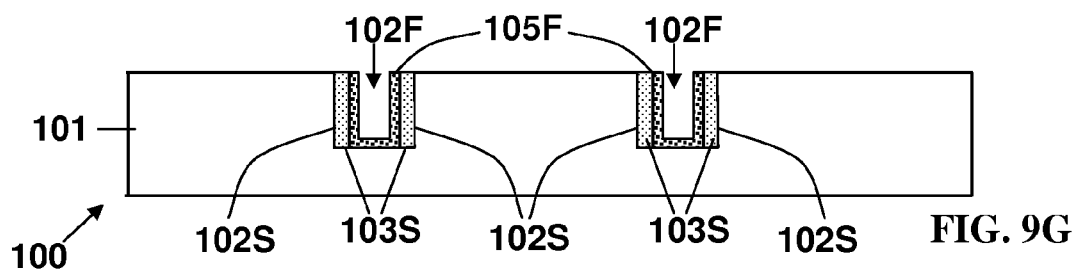

FIG. 9G shows the reticle 100 of FIG. 9F after planarization of the opaque-absorber film 105C in accordance with step Q in FIG. 10B. The planarization step polishes away the conformal, opaque-absorber, actinic or light blocking film 105C from the top surface of the mask plate 101 forming a pair of features 105F from the planarized portion of the opaque-absorber film 105C, inside the sacrificial sidewall spacers 103S. The sacrificial sidewall spacers 103S remain lining the initial feature recess 102 with light blocking features 105F nested therein. However, at this point the now unwanted sacrificial sidewall spacers 103S also remain in the feature recess 102, and the narrower feature recesses 102''' remain slightly shallower defining modified preliminary features 105F.

FIG. 9H shows the reticle 100 of FIG. 9G after stripping the sacrificial sidewall spacers 103S from the recess sidewalls 102S (in accordance with step R in FIG. 10B) leaving open spaces 107O between the planarized conformal, opaque-absorber, actinic or light blocking features 105F and the sidewalls 102S. The narrower and shallower feature recesses 102" remain with open spaces 107O juxtaposed therewith. Sacrificial films, which are well known in the industry, can be carbonaceous materials that can be removed by oxygen based processes such as oxygen plasma stripping or other means.

Using this embodiment will allow filling of open spaces 107O and then capping the reticle 100 as shown in FIG. 9I wherein the open spaces 107O have been filled with a transparent, phase-error-correction filler 107F (in accordance with step S in FIG. 10B) which can be solid or fluid (liquid or gas) to allow the exposure ambient to correct for any phase errors. This can be done for both via structures as well as line/space patterns. The index of refraction of the material in the open spaces 107O/107F will determine the exact phase change in conjunction with the depth of the trench 102. This embodiment allows precise control of the phase change of the actinic wavelength in the path through the space area by virtue of keeping the n*length constant, independent of processing variables.

FIG. 9I shows reticle 100 of FIG. 9H after formation of protective capping layer 109 (in accordance with step T in FIG. 10B) over the surface of device 100 leaving the open spaces 107O juxtaposed with the planarized conformal, opaque-absorber, actinic or light blocking film 105P. The capping layer 109 can be laminated, sputtered, or applied by any other method that does not interfere with the gap. Alternatively, the protective capping layer 109 can be deposited without filling the gap 107O. This is done by utilizing the dimensions of the gap. It is well known in the industry that deposition non-conformally by means of vapor deposition results in what is referred to as "poor gap fill" in the industry. It is this very same "poor gap fill" that is employed at this stage in the process to create an embedded/protected unfilled gap in accordance with this invention. At this point planarization (not shown) can be performed.

Ninth Embodiment

Open Peripheral Space Via Feature

Figure 11:
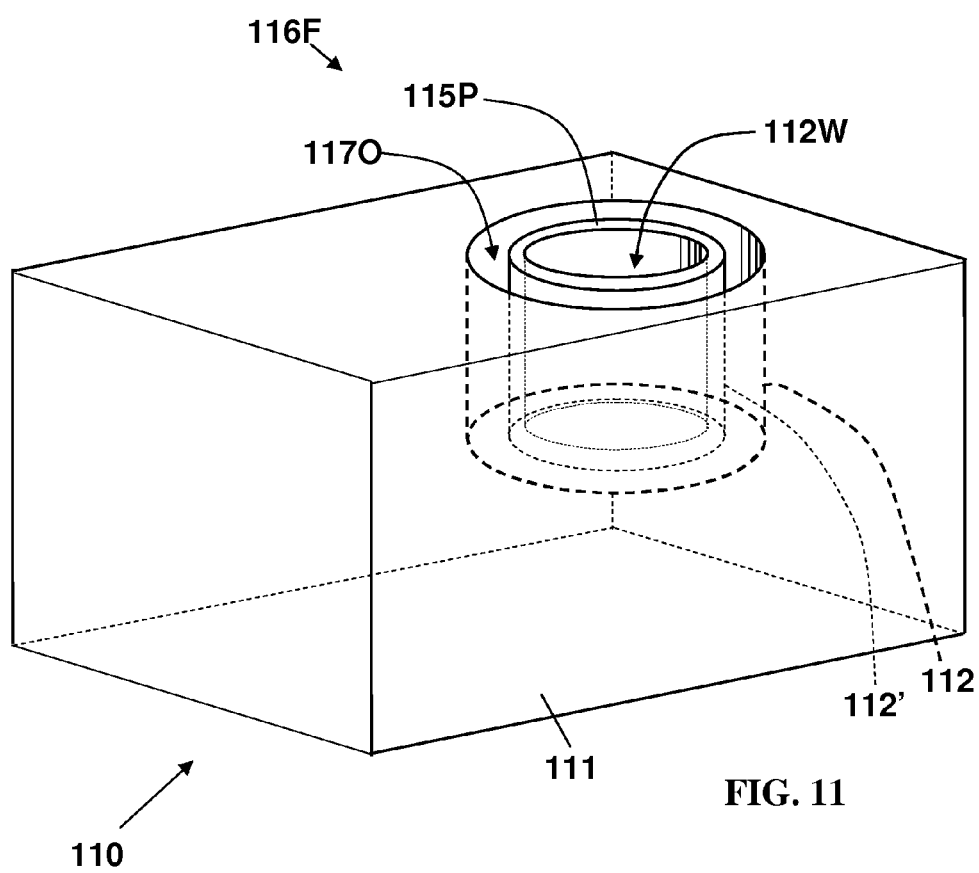
FIG. 11 is a perspective view depicting a reticle with an open peripheral space via feature in accordance with this invention in which an annular, via type via feature is formed for a structure, e.g. a semiconductor via, in a transparent reticle mask plate.

FIG. 11 is a top perspective view depicting a reticle 110 in accordance with this invention in which an annular, via type via feature 116F is formed for a structure, e.g. a semiconductor via, in a mask plate 111 comprising a transparent reticle mask plate. The reticle 110 is made in accordance with the method of this invention, as shown by the flow chart in FIGS. 10A/10B. As in FIGS. 9B and 9C and steps B and C in FIGS. 10A/10B, first step is to etch the cylindrical initial feature recess 112 down into the mask plate 111. Then line the cylindrical initial feature recess 112 with a sacrificial layer (not shown) as described above (FIGS. 9E and 9F, steps M1N in FIG. 10A) and form a narrower cylindrical recess 112'. Next, line the narrower cylindrical recess 112' with an actinic absorber film as in FIGS. 9E and 9F (according to steps P and Q in FIG. 10B) and planarize to form the actinic absorber film 115P thereby producing a via patterning feature 116F. Then remove the sacrificial layer as in FIG. 9H and step R in FIG. 10B. A hollow well 112W remains inside the conformal light blocking film 115P and there is an open, i.e. hollow, annular space 117O separating the planarized conformal, opaque-absorber, actinic or light blocking film 115P from the sidewalls of the original recess 112.

Tenth Embodiment

Open Peripheral Space Line Feature

Figure 12:
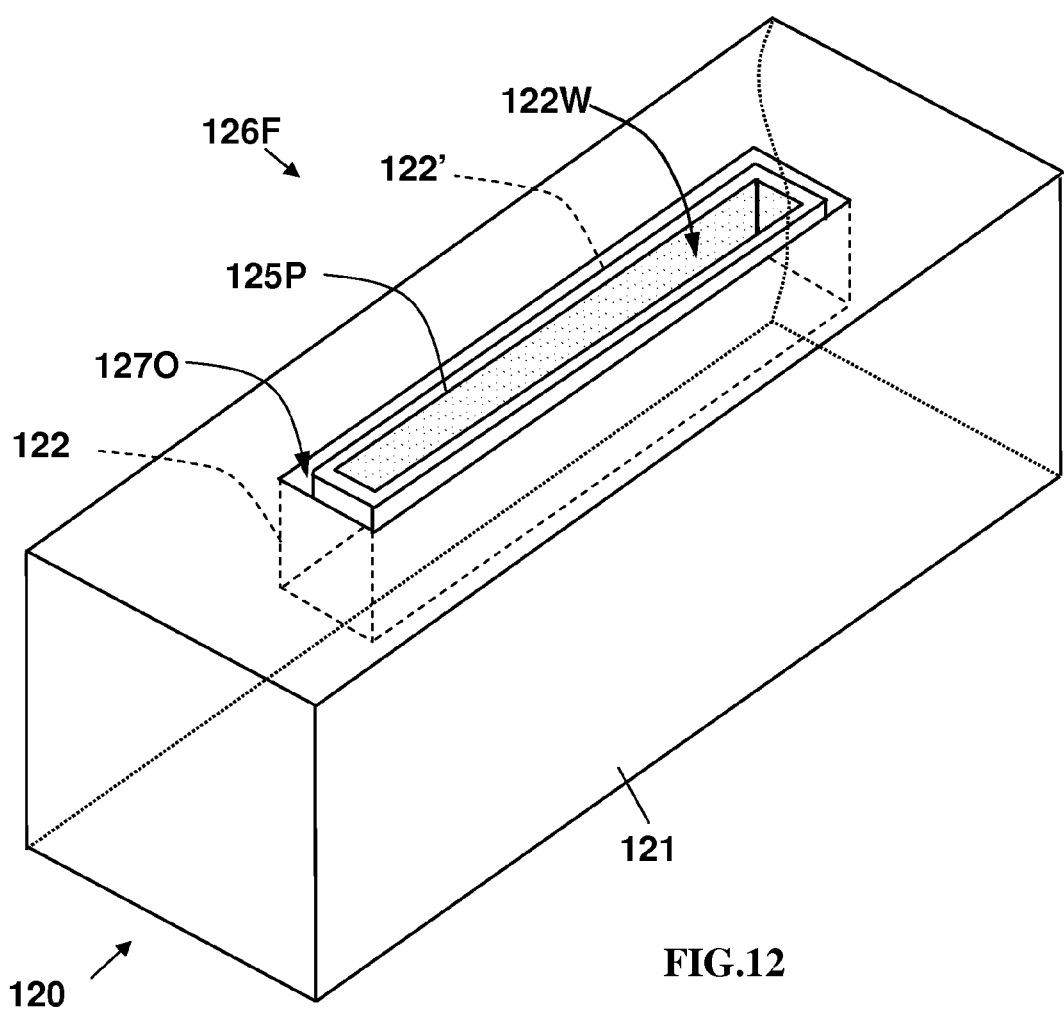
FIG. 12 is a perspective view of an open peripheral space line feature in accordance with this invention depicting a reticle showing a rectangular type line patterning feature in a transparent reticle mask plate with the planarized light blocking material formed in a linear feature recess leaving a narrow feature recess inside the light blocking film.

FIG. 12 shows a top perspective view depicting a reticle 120 in accordance with this invention in which an rectangular type line patterning feature 126F is shown in a mask plate 121 (comprising a transparent reticle mask plate) with the planarized light blocking 125P material formed in a linear feature recess 122 leaving a narrow feature recess 122W inside the light blocking film 125P. The reticle 120 is made in accordance with the method of this invention, as shown by the flow chart of FIGS. 10A/10B. In this case the first step is to etch a rectangular initial feature recess 122 into the mask plate 121. Then line the rectangular initial feature recess 122 with a sacrificial film (not shown) forming a narrower, rectangular recess 122'. Then planarize the sacrificial film to form a sacrificial sidewall spacer, as described above with respect to FIGS. 9D-9E. Next line the additional narrower rectangular recess 122' with a conformal light blocking film covering the sidewalls and bottom of the additional narrower rectangular recess. Then planarize to produce a line patterning feature 126F. A hollow well 122W remains inside the conformal light blocking film 125P. Then remove the sacrificial material leaving a peripheral open space 127O surrounding the light blocking film 125P. In summary, the line patterning feature 126F was formed in the rectangular initial feature recess 122.

Damascene Reticle Chemical Mechanical Planarization

The processing required to achieve the above embodiments requires a method of Damascene Reticle Chemical Mechanical Planarization (DRCMP) of damascene reticles which is different from Semiconductor Wafer CMP (SWCMP) of semiconductor wafers. The DRCMP method is different from SWCMP because a reticle mask has a very different size and shape compared to a silicon wafer. Also, the necessary films on a reticle mask can be deposited in a different order from the order employed for performing SWCMP on surfaces of a silicon wafer. The following example is provided to facilitate explanation of the process involved, while it is intended to be clear that the materials can be changed and/or the order changed as will be well understood by those skilled in the art.

After a feature is etched into a reticle mask plate a conformal layer of optically transparent or light wave passing material is deposited. The material can be selected from a range of materials that include but are not limited to silicon dioxide ($SiO_2$), silicon nitride ($Si_3N_4$), and TEOS. Experimentation was done with silicon nitride. A problem with the structure of this invention is that a silicon nitride layer formed on a silicon dioxide substrate is formed in the reverse order from that usually employed by SWCMP planarization. A silicon nitride layer is usually used as a polish stop especially when polishing silicon oxide, as is well known in the industry. A number of silica based slurries appropriate for such CMP processing are commercially available for the conventional SWCMP application. The relative polish rates, or selectivity, of these slurries typically range from about 3:1 to about 4:1, with silicon dioxide having the higher polish rate.

In contrast in the case of the present invention, for reticle polishing, it is necessary to polish the silicon nitride and then to stop on the top surface of the reticle which is composed of quartz that is a material which is very similar to silicon dioxide used in the semiconductor industry. This requires provision of a slurry and a process with the reverse selectivity to the silica based slurries described above whereby the silicon nitride polish rate is substantially higher than the silicon dioxide polish rate.

Slurry Formulation

A slurry formulation in accordance with this invention (described below) provides the needed "reverse selectivity," with a ratio of polish rates where the silicon nitride is polished at a rate 3 to 4 times faster than the silicon oxide. Thereafter Tantalum Nitride (TaN) and Tantalum (Ta) were deposited to allow this material to be the internally placed light blocking material. It was therefore necessary to employ semiconductor polishing chemistries and processing to provide adequate removal of the materials from the upper surface of the reticle mask plate without disrupting the internally placed materials (with reference to the plate) and avoiding damage to the upper surface that would result in unwanted imaging on the reticle mask plate the image is projected upon.

Two exemplary slurry chemistries, tool types, and process parameters are described next. There are many different process tools available and the process parameters will vary as the tool models vary as will be well understood by those skilled in the art.

1) Ta CMP Slurry and Process, Stopping on Silicon Nitride

A semiconductor slurry is employed to remove TaN/Ta (Tantalum Nitride/Tantalum) stopping on the silicon nitride. The slurry formulation suppresses a silicon oxide and silicon nitride polish rate while maintaining a Ta polishing rate. A representative slurry formulation is shown in FIG. 15.

Damascene Reticle CMP Process

In FIG. 16, a table is shown with the processing parameters and equipment employed for performing an exemplary DRCMP process in accordance with this invention.

2) CMP Slurry and Process for Removing $Si_3Na$ and Stopping on $SiO_2$.

A slurry formulation is provided to remove silicon nitride and stop on silicon oxide. The selectivities are reversed as compared to a normal silica slurry. The slurry is prepared using a commercially available fumed silica suspension in water. This starting material, as obtained, is stabilized in alkaline media, with potassium hydroxide or ammonium hydroxide, to a pH of 9.5 to 12. The "reverse selectivity" slurry is prepared by adjusting the pH of the starting material to 2.4 (range 2.3 to 2.5) with dilute phosphoric acid. This acid solution is prepared by diluting 1 part of 86 percent phosphoric acid with 9 parts of water. The final pH of the slurry is critical to achieving the desired ratio of polish rates. The preparation of this slurry is shown in the table of FIG. 16.

CMP Process

In FIG. 17 another table is shown with an implementation of the DRCMP process of this invention.

Reticle Polishing Carrier

Figure 13A:
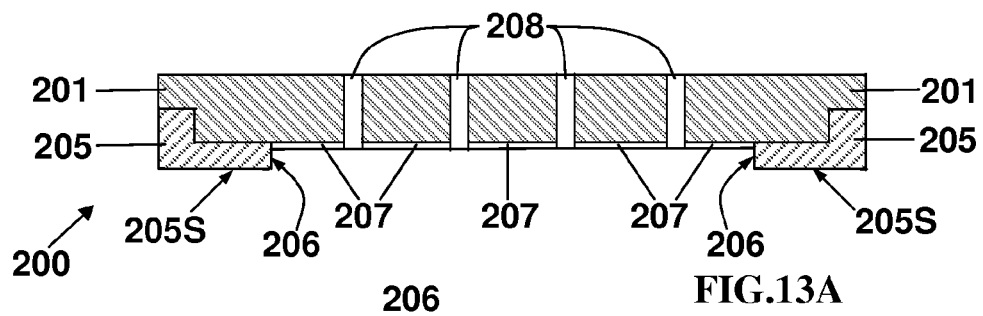
FIGS. 13A and 13B show sectional and bottom views respectively of a reticle polishing carrier in accordance with this invention which is adapted for use with a wafer polishing tool for the purpose of reticle polishing.
Figure 13B:
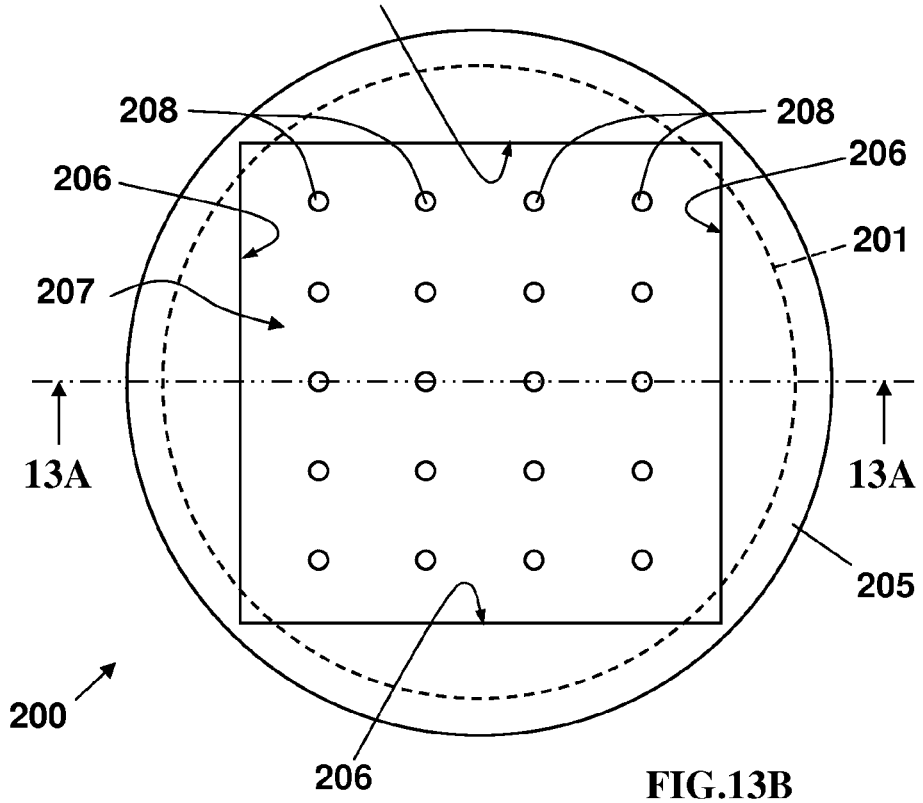
Figure 14A:
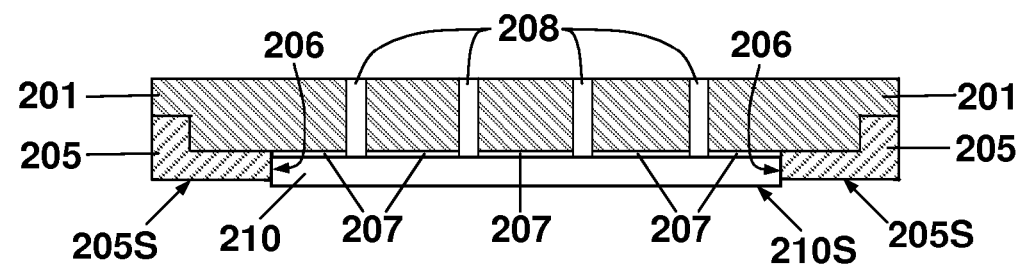
FIGS. 14A and 14B show sectional and bottom views respectively of the reticle polishing carrier of FIGS. 13A and 13B with a reticle inserted therein for polishing.
Figure 14B:
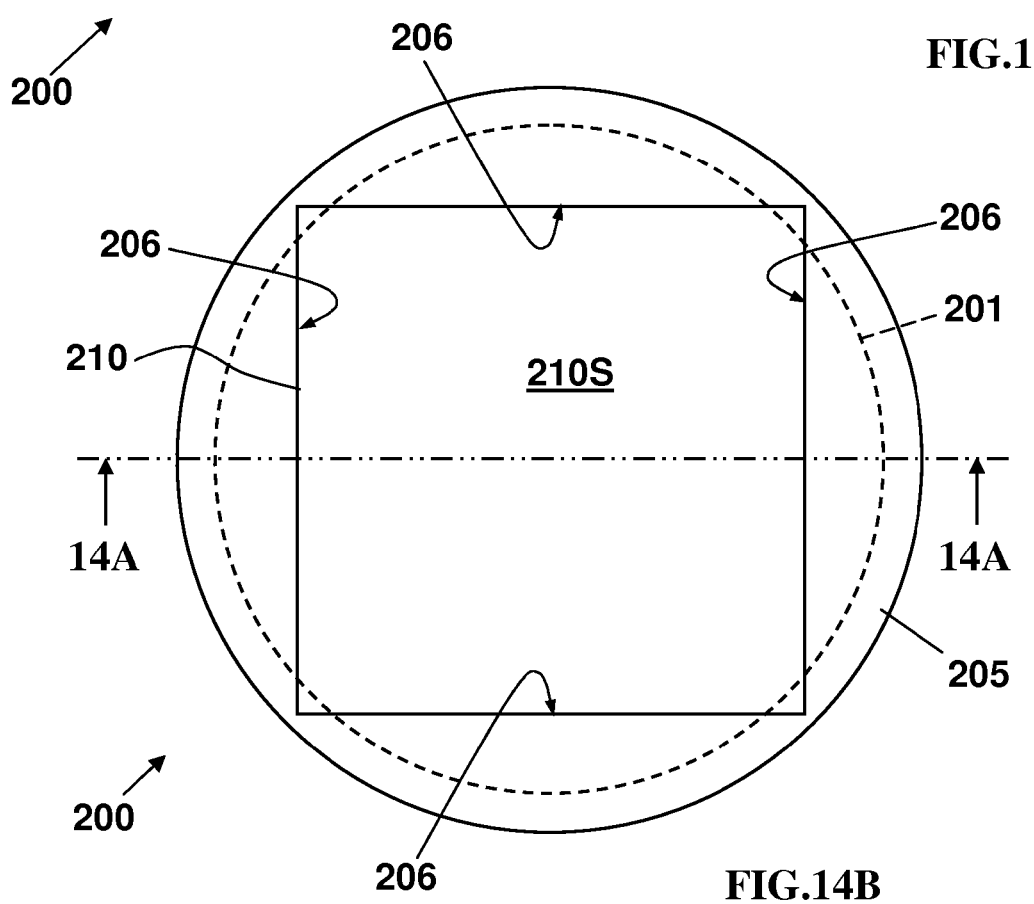

FIGS. 13A and 13B show sectional and bottom views respectively of a reticle polishing carrier 200 in accordance with this invention which is adapted for use with a wafer polishing tool for the purpose of reticle polishing. FIGS. 14A and 14B show sectional and bottom views respectively of the reticle polishing carrier 200 of FIGS. 13A and 13B with a reticle 210 inserted therein for polishing.

Referring to FIGS. 13A and 13B and 14A and 14B, a reticle polishing carrier 200 in accordance with this invention is shown which is adapted for use with a wafer polishing tool (not shown) for the purpose of DRCMP reticle polishing. This is significant because such polishing tools are made for SWCMP polishing of semiconductor wafers, which are round and have a relatively small thickness on the order of only 0.03 inches (0.0762 cm) as compared to a damascene reticle that is square or rectangular that has a relatively large thickness of about 0.25 inches (0.635 cm) which is approximately an order of magnitude larger.

Accordingly it was required to fabricate a reticle polishing carrier 200 for a wafer polishing tool capable of accommodating a thick reticle 210 shown in FIG. 14A. The reticle polishing carrier 200 is made of component parts that include a rigid base plate 201, a retaining ring 205, and a reticle pad 207 to support the reticle 210 when it is positioned in place, i.e. mounted, on the reticle carrier 200. The inner edges 206 match the external dimensions of the reticles to be process to retain such reticles 210 (shown in FIGS. 14A/14B in position during planarization. The retaining ring 205 is made of a chemically inert yet dimensionally stable polymeric material such as PolyTetraFluoroEthylene (PTFE), Delrin, PolyEtherEtherKetone (PEEK), and other similar commercially available materials.

The base plate 201 is preferably made of a rigid but corrosion resistant material such as titanium or stainless steel. The base plate 201 and the reticle pad have a series of matching aligned passageways 208 therethrough for exhaustion of air from the space between the base plate 201 and the reticle 210. Additionally, a vacuum can be applied via passageways 208 to retain the reticle 210 in place while the reticle is being transported into position for polishing on the CMP pad and transported off the CMP pad after completion of polishing. During the actual polishing process air pressure can be applied to the back side of the reticle 210. This has the advantage of distributing the downwardly applied force across the entire area of the reticle 210, to improve the uniformity of material removal.

The thickness of a retaining ring 205 is selected to match the specified thickness of the reticle 210 so that the surface 210S of the reticle 210 and the surface 205S of the retaining ring 205 are nearly coplanar. This is essential to enable the uniform removal of material from the square reticle 210, using a semiconductor manufacturing tool designed for SWCMP processing of round wafers. By making the surfaces of the reticle 210 and the retaining ring 205 nearly coplanar, the square shape of the reticle 210 will be properly embedded in the carrier 200, and a problem will be avoided in that the straight edges of the reticle 210 will not be disproportionately eroded by the polishing pad (not shown.) The polishing process can be further optimized for uniformity across the diameter of the reticle 210 by careful adjustment of the level of the exposed reticle surface 210S to be just above or just below (by plus or minus approx 0.010 inches) the surface 205S of the retaining ring 205. Raising the reticle 210 higher than the retaining ring 205 will increase polishing at the edge of the reticle 210, while lowering the reticle surface 210S will decrease polishing at the edge.

"Delrin is the brand name for an acetal resin engineering plastic invented and sold by DuPont. Often marketed and used as a metal substitute, Delrin is a lightweight, low-friction, and wear-resistant plastic capable of operating in temperatures in excess of 90° C." Other names for this compound include: PolyOxyMethylene (POM), acetal resin, polytrioxane and polyformaldehyde."

Materials Suitable for a Blank Transparent Mask Plate

A list of materials preferred for blank transparent mask plates includes crystalline aluminum oxide, lithium indium selenide, fused silica, Other materials which may be suitable for various optical ranges. It is necessary to match the material to the wavelength for either blocking or passing the energy. For example aluminum oxide ($Al_2O_3$), and beryllium can be used for x-ray. Calcium fluoride ($CaF_2$), zinc selenide (ZnSe), sodium chloride (NaCl), barium fluoride ($BaF_2$) can be used for infrared. $Al_2O_3$ which has several crystal forms which are called corundum, sapphire or ruby (depending on the color.) Sapphire comprises a single-crystal form of $Al_2O_3$ can be employed for infrared optical applications. Sapphire is unique when compared to optical materials useful within its transmission range because it is strong, and tough. Also, sapphire is resistant to both thermal shock and chemicals, and can be used at high temperatures. The thermal conductivity of sapphire is relatively high despite its extreme electrical non-conductivity. Sapphire has a moderate refractive index, transparency in the visible range of wavelengths, good transmission and relatively low emission at high temperatures plus unusual stability. $CaF_2$ can be used as a window material for both infrared and ultraviolet wavelengths At wavelengths as low as 157 nm, $CaF_2$ is useful for semiconductor manufacturing and as an ultraviolet optical material for integrated circuit lithography. $CaF_2$ is transparent in the range from about 0.15 µm to about 9 µm at which it exhibits extremely weak birefringence. $BaF_2$ is transparent from the ultraviolet to the infrared, from about 150-200 nm to about 11-11.5 µm, and can be used as a material to make optical components such as lenses. $BaF_2$ is used in windows for infrared spectroscopy and its transmittance at 200 nm is relatively low at 0.60, but at 500 nm it goes up to 0.96-0.97 and stays at that level until 9 µm, then falls off (e.g. 0.85 for 10 µm and 0.42 for 12 µm). Magnesium fluoride ($MgF_2$) is transparent over a wide range of wavelengths. Windows, lenses, and prisms made of $MgF_2$ can be used over the entire range of wavelengths from 0.140 µm (ultraviolet) to 8.0 µm (infrared). FIG. 18 shows a list of certain transparent materials and their refractive indices.

ADVANTAGES OF THE INVENTION

The method of this invention increases the yield of optical projection mask making in terms of resolution and the process window. The method of this invention improves yield in the fabrication of integrated circuits due to smaller line edge roughness. The method of this invention also improves the lifetime of optical projection masks due to the fact that the patterns in the mask have damascene patterns embedded in a reticle mask plate.

The foregoing description discloses only exemplary embodiments of the invention. Modifications of the above disclosed apparatus and methods which fall within the scope of the invention will be readily apparent to those of ordinary skill in the art. While this invention is described in terms of the above specific exemplary embodiment(s), those skilled in the art will recognize that the invention can be practiced with modifications within the spirit and scope of the appended claims, i.e. changes can be made in form and detail, without departing from the spirit and scope of the invention. Accordingly, while the present invention is disclosed in connection with exemplary embodiments thereof, it should be understood that changes can be made to provide other embodiments which may fall within the spirit and scope of the invention and all such changes come within the purview of the present invention and the invention encompasses the subject matter defined by the following claims.

What is claimed is:

1. A reticle carrier for a polishing tool capable of accommodating a reticle comprising:
   a rigid base plate with an obverse surface and a reverse surface on opposite sides thereof;
   a retaining ring having internal edges;
   said retaining ring secured to said obverse surface of said rigid base plate forming a recess defined by said obverse surface of said rigid base plate and said internal edges of said retaining ring;
   a reticle pad for supporting a reticle positioned on said obverse surface of said rigid base plate in said recess;
   said internal edges of said retaining ring and said reticle pad defining a hollow space for housing said reticle in said recess; and
   said rigid base plate and said reticle pad having an array of matching, aligned passageway holes therethrough for exhaustion of first air from space between said base plate and said reticle and for supply of second air to said space;
   whereby a vacuum can retain said reticle in place on said reticle carrier under vacuum conditions and application of the second air under pressure can eject said reticle from said reticle carrier.

2. The reticle carrier of claim 1 wherein said rigid base plate comprises a solid disk, said reticle pad is flat and said rigid base plate and said reticle pad are formed with said array of matching aligned passageway holes passing from said reverse surface through said obverse surface and through said reticle pad.

3. The reticle carrier of claim 2 wherein said retaining ring is composed of a chemically inert and stable material.

4. The reticle carrier of claim 2 wherein said rigid base plate is composed of a corrosion resistant material.

5. The reticle carrier of claim 2 wherein said rigid base plate is composed of a corrosion resistant material comprising titanium or stainless steel.

6. The reticle carrier of claim 2 including said reticle housed in said hollow space.

7. The reticle carrier of claim 6 wherein said internal edges match dimensions of said reticle.

8. The reticle carrier of claim 7 wherein a thickness of said retaining ring is selected to match a specified thickness of said reticle such that an external surface of said reticle and an external surface of said retaining ring are nearly coplanar to prevent disproportionate eroding of said reticle.

9. The reticle carrier of claim 2 wherein:
said reticle comprises a mask plate having a first level of transmissivity with a feature recess in said mask plate; and
said feature recess is filled with a material having a different level of transmissivity from said first level of transmissivity.

10. The reticle carrier of claim 1 including said reticle housed in said hollow space.

11. The reticle carrier of claim 10 wherein said internal edges match dimensions of said reticle.

12. The reticle carrier of claim 11 wherein thickness of said retaining ring is selected to match a specified thickness of said reticle such that an external surface of said reticle and an external surface of said retaining ring are nearly coplanar to prevent disproportionate eroding of said reticle.

13. The reticle carrier of claim 10 wherein:
said reticle comprises a mask plate having a first level of transmissivity with a feature recess in said mask plate; and
said feature recess is filled with a material having a different level of transmissivity from said first level of transmissivity.

* * * * *